United States Patent
Qiu

(10) Patent No.: US 11,451,653 B2
(45) Date of Patent: Sep. 20, 2022

(54) FILM STRUCTURE, SHELL, AND ELECTRONIC DEVICE

(71) Applicant: GUANGDONG OPPO MOBILE TELECOMMUNICATIONS CORP., LTD., Guangdong (CN)

(72) Inventor: Jinglong Qiu, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 238 days.

(21) Appl. No.: 16/902,531

(22) Filed: Jun. 16, 2020

(65) Prior Publication Data

US 2020/0404086 A1 Dec. 24, 2020

(30) Foreign Application Priority Data

Jun. 19, 2019 (CN) .......................... 201910531772.0

(51) Int. Cl.
*H04M 1/04* (2006.01)
*H04M 1/02* (2006.01)
(Continued)

(52) U.S. Cl.
CPC ............. *H04M 1/0283* (2013.01); *B32B 7/12* (2013.01); *B44C 1/16* (2013.01); *B44C 3/02* (2013.01); *H05K 5/0243* (2013.01)

(58) Field of Classification Search
CPC ..... H04M 1/02; H04M 1/0283; B44C 1/1704; B44C 1/16; B44C 1/175; B05D 7/06; B05D 5/06; B05C 3/104
See application file for complete search history.

(56) References Cited

U.S. PATENT DOCUMENTS

2009/0141472 A1* 6/2009 Choi .................... C08G 59/621
428/354
2010/0018644 A1 1/2010 Sacks et al.
(Continued)

FOREIGN PATENT DOCUMENTS

| CN | 108347496 A | 7/2018 |
| CN | 108859565 A | 11/2018 |

(Continued)

OTHER PUBLICATIONS

English Translation First Office Action from China patent office in a counterpart Chinese patent Application 201910531772.0, dated Jul. 10, 2020 (22 pages).

(Continued)

*Primary Examiner* — Thanh C Le
(74) *Attorney, Agent, or Firm* — Young Basile Hanlon & MacFarlane, P.C.

(57) ABSTRACT

A film structure, a method for manufacturing the film structure, a shell, and an electronic device are disclosed. The film structure includes a first film assembly and a second film assembly. The first film assembly includes a first film and a texture layer stacked sequentially. The second film assembly includes a second film and a ribbon unit disposed on the second film. The second film assembly is laminated on the first film assembly. The ribbon unit is located adjacent to the first film, and an orthographic projection of the ribbon unit projected on a plane on which the texture layer is located falls in the texture layer.

20 Claims, 10 Drawing Sheets

(51) Int. Cl.
*B32B 7/12* (2006.01)
*B44C 1/16* (2006.01)
*B44C 3/02* (2006.01)
*H05K 5/02* (2006.01)

(56) References Cited

U.S. PATENT DOCUMENTS

| | | | |
|---|---|---|---|
| 2012/0008271 A1* | 1/2012 | Bhutani | B32B 7/12 428/457 |
| 2019/0210324 A1* | 7/2019 | Yializis | B65D 65/403 |
| 2020/0024859 A1* | 1/2020 | Spicer | B32B 3/30 |
| 2020/0116901 A1 | 4/2020 | Hong et al. | |

FOREIGN PATENT DOCUMENTS

| | | |
|---|---|---|
| CN | 108973487 A | 12/2018 |
| CN | 109605893 A | 4/2019 |
| CN | 109624579 A | 4/2019 |
| CN | 109677062 A | 4/2019 |
| CN | 110229631 A | 9/2019 |
| CN | 110267471 A | 9/2019 |
| CN | 110281682 A | 9/2019 |
| JP | H0790548 A | 4/1995 |
| JP | 2013177713 A | 9/2013 |
| WO | 2004098906 A2 | 11/2004 |
| WO | 2018210222 A1 | 11/2018 |
| WO | 2019013254 A1 | 1/2019 |

OTHER PUBLICATIONS

International search report, PCT/CN2020/097061, dated Aug. 27, 2020 (12 pages).
European search report, EP20180534, dated Nov. 2, 2020 (8 pages).
China Second Office Action with English Translation for CN Application 201910531772.0 dated Mar. 1, 2021. (26 pages).
Chinese Notification to Grant Patent Right for Invention with English Translation for CN Application 201910531772.0 dated Feb. 11, 2022. (6 pages).
Chinese Office Action with English Translation for CN Application 201910531772.0 dated Aug. 10, 2021. (18 pages).
Indian Examination Report for IN Application 202014025708 dated May 28, 2021. (6 pages).

* cited by examiner

FILM STRUCTURE, SHELL, AND ELECTRONIC DEVICE

CROSS-REFERENCE TO RELATED APPLICATION(S)

This application claims priority to Chinese Patent Application No. 201910531772.0, filed on Jun. 19, 2019, the content of which is herein incorporated by reference in its entirety.

TECHNICAL FIELD

The present disclosure relates to the technical field of electronic devices, in particular relates to a film structure, a shell, and an electronic device.

BACKGROUND

With the development of the diversity of the electronic devices, users put forward higher requirements for the appearance of the electronic devices. It is a research and development direction of common concern in the industry that how to improve the appearance effect of the electronic devices. In some researches, the offset printing technology is applied to transfer printing patterns to the electronic devices to make the electronic devices present patterns. However, the pattern acquired in this way has single style.

SUMMARY

Therefore, it is necessary to provide a film structure with pattern with more styles.

Furthermore, a method for manufacturing the film structure, a shell, and an electronic device are provided.

A film structure, comprising: a first film assembly, comprising a first film and a texture layer stacked on one another sequentially; and a second film assembly, comprising a second film and a ribbon unit disposed on the second film, wherein the second film assembly is stacked on the first film assembly, the ribbon unit is located adjacent to the first film, and an orthographic projection of the ribbon unit projected on a plane on which the texture layer is located falls in the texture layer.

In some embodiments, the texture layer comprises a first texture area, a plurality of first convex bars parallel to each other and a plurality of second convex bars parallel to each other are disposed in the first texture area; the plurality of first convex bars and the plurality of second convex bars are alternately arranged, and a height of each second convex bar is less than a height of each first convex bar.

In some embodiments, each of the plurality of first convex bars and an adjacent one of the plurality of second convex bars are arranged without a gap.

In some embodiments, the texture layer comprises a first texture area, a plurality of convex bar groups spaced apart from each other are disposed in the first texture area, each convex bar group comprises a first convex bar and a second convex bar parallel to and spliced with each other, and a height of each second convex bar is less than a height of the first convex bar.

In some embodiments, the plurality of convex bar groups are arranged in an array.

In some embodiments, a cross section of each first convex bar in a direction perpendicular to an extension direction of the first convex bar is in shape of a triangle or a trapezoid; and/or a cross section of each second convex bar in a direction perpendicular to an extension direction of the second convex bar is in shape of a triangle or a trapezoid.

In some embodiments, the cross section of each first convex bar in the direction perpendicular to the extension direction of the first convex bar is in shape of an isosceles triangle; and/or the cross section of each second convex bar in the direction perpendicular to the extension direction of the second convex bar is in shape of an isosceles triangle.

In some embodiments, a height difference between the first convex bar and the second convex bar is in a range from 2 μm to 4 μm.

In some embodiments, a width of the first convex bar is equal to a width of the second convex bar.

In some embodiments, the ribbon unit comprises a first ribbon area, a position of the first ribbon area corresponds to a position of the first texture area, and an orthographic projection of the first ribbon area projected on a plane on which the first texture area is located falls in the first texture area.

In some embodiments, the ribbon unit comprises a first monochrome layer and a gradient color layer disposed in the first ribbon area, the first monochrome layer is disposed on the second film, and the gradient color layer is disposed at one side of the first monochrome layer away from the second film.

In some embodiments, an orthographic projection of the first ribbon area projected on a plane on which the first texture area is located coincides with the first texture area completely.

In some embodiments, the texture layer comprises a second texture area, and a plurality of third convex bars parallel to each other are disposed in the second texture area.

In some embodiments, a cross section of each third convex bar in a direction perpendicular to an extension direction of the third convex bar is in shape of a triangle or a trapezoid.

In some embodiments, the ribbon unit comprises a second ribbon area, a position of the second ribbon area corresponds to a position of the second texture area, and an orthographic projection of the second ribbon area projected on a plane on which the second texture area is located falls in the second texture area.

In some embodiments, the orthographic projection of the second ribbon area on the plane on which the second texture area is located coincides with the second texture area completely.

In some embodiments, the ribbon unit comprises a plurality of second monochrome layers in the second ribbon area, and the plurality of second monochrome layers are stacked on the second film sequentially.

In some embodiments, the first film assembly further comprises a reflection unit, and the reflection unit is coated at one side of the texture layer away from the first film.

In some embodiments, the reflection unit comprises: an attaching layer, disposed at one side of the texture layer away from the first film; a first refraction layer, disposed at one side of the attaching layer away from the texture layer; and a second refraction layer, disposed at one side of the first refraction layer away from the attaching layer, and a refractive index of the first refraction layer is less than a refractive index of the second refraction layer.

In some embodiments, the refractive index of the first refraction layer is in a range from 0.68 to 0.72, and the refractive index of the second refraction layer is in a range from 2.55 to 2.76.

In some embodiments, the reflection unit further comprises an interlayer, the interlayer is located between the first refraction layer and the second refraction layer, and the interlayer is an alumina layer or a silicon dioxide layer.

In some embodiments, the attaching layer is an alumina layer, and a thickness of the attaching layer is in a range from 30 nm to 40 nm; the first refraction layer is an indium layer, and a thickness of the first refraction layer is in a range from 10 nm to 30 nm; the interlayer is an alumina layer, and a thickness of the interlayer is in a range from 30 nm to 40 nm; and the second refraction layer is a titanium dioxide layer, and a thickness of the second refraction layer is in a range from 3 nm to 7 nm.

In some embodiments, the reflection unit further comprises a third refraction layer, the third refraction layer is located between the attaching layer and the first refraction layer, and a refractive index of the third refraction layer is greater than the refractive index of the first refraction layer.

In some embodiments, the refractive index of the third layer is in a range from 2.55 to 2.76.

In some embodiments, the reflection unit further comprises a first protection layer and a second protection layer, the first protection layer is located between the first refraction layer and the third refraction layer, the second protection layer is located between the first refraction layer and the second refraction layer, the first protection layer is an alumina layer or a silicon dioxide layer, and the second protection layer is an alumina layer or a silicon dioxide layer.

In some embodiments, the attaching layer is a silicon dioxide layer, and a thickness of the attaching layer is in a range from 8 nm to 12 nm; the third refraction layer is a trititanium pentoxide layer, and a thickness of the third refraction layer is in a range from 7 nm to 17 nm; the first protection layer is a silicon dioxide layer, and the thickness of the first protection layer is in a range from 10 nm to 20 nm; the first refraction layer is an indium layer, and a thickness of the first refraction layer is in a range from 10 nm to 20 nm; the second protection layer is a silicon dioxide layer, and a thickness of the second protection layer is in a range from 20 nm to 30 nm; and the second refraction layer is a trititanium pentoxide layer, and a thickness of the second refraction layer is in a range from 5 nm to 9 nm.

In some embodiments, the first film assembly further comprises an ink layer, and the ink layer is coated at one side of the reflection unit away from the texture layer.

A method for manufacturing a film structure, comprising: providing a first film assembly, wherein the first film assembly comprises a first film and a texture layer stacked on one another sequentially; forming a ribbon unit on a second film by a color-band transfer-printing process, and acquiring a second film assembly; attaching one side of the ribbon unit away from the second film to one side of the first film away from the texture layer, such that an orthographic projection of the ribbon unit projected on the texture layer falls on the texture layer, thereby acquiring the film structure.

In some embodiments, before attaching one side of the ribbon unit away from the second film to one side of the first film away from the texture layer, further comprising an operation of manufacturing the first film assembly; wherein the manufacturing the first film assembly comprises: forming the texture layer on the first film by a UV transfer-printing process, thereby acquiring the film assembly.

In some embodiments, the forming the texture layer on the first film comprises:
disposing a plurality of first convex bars parallel to each other and a plurality of second convex bars parallel to each other on the first film to form a first texture area and acquiring the texture layer; wherein the plurality of first convex bars and the plurality of second convex bars are alternately arranged, and a height of each second convex bar is less than a height of each first convex bar.

In some embodiments, the forming the ribbon unit on the second film by the color-band transfer-printing process comprises: forming a first monochrome layer and a gradient color layer on the second film by the color-band transfer-printing process, and the gradient color layer is disposed at one side of the first monochrome layer away from the second film, thereby forming a the first ribbon area and acquiring the ribbon unit; a position of the first ribbon area corresponds to a position of the first texture area.

In some embodiments, the forming the texture layer on the first film comprises:
forming a plurality of third convex bars parallel to each other on the first film, thereby forming a second texture area and acquiring the texture layer.

In some embodiments, the forming the ribbon unit on the second film by the color-band transfer-printing process comprises: sequentially disposing a plurality of second monochrome layers on the second film by the color-band transfer-printing process, thereby forming a second ribbon area and acquiring the ribbon unit; wherein a position of the second ribbon area corresponds to a position of the second texture area.

A shell, comprising: a substrate; and the film structure as previously described, wherein the film structure is located on the substrate, and one side of the film structure adjacent to the second film faces towards the substrate.

An electronic device, comprising: the shell as previously described; a display connected to the shell, wherein an installation room is defined by the display and the shell; and a circuit board, located in the installation room and electrically connected to the display.

BRIEF DESCRIPTION OF DRAWINGS

Implementations are described by way of example only with reference to the attached drawings. The drawings here are used to further explain the present disclosure, and as a part of the application. The schematic embodiments of the present disclosure and the description are used to explain the present disclosure, and not as an improper limitation of the present disclosure.

DETAILED DESCRIPTION

Figure 1:
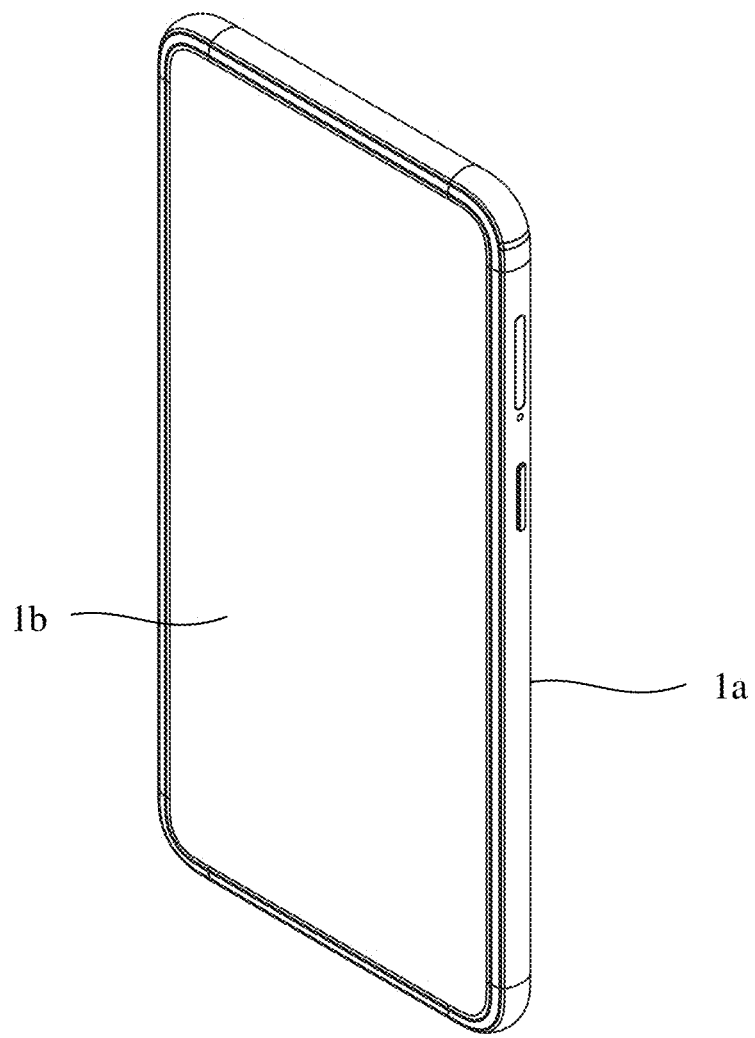
FIG. 1 is a structural view of an electronic device according to some embodiments of the present disclosure.

In order to facilitate the understanding of the present disclosure, a description in detail of the present disclosure will be given below with reference to the relevant drawings. Embodiments of the present disclosure are given in the drawings. However, the present disclosure can be implemented in many different ways and is not limited to the embodiments described herein. On the contrary, the purpose of providing these embodiments is to make one understand the present disclosure more thoroughly and fully.

Unless otherwise defined, all technical and scientific terms used herein have the same meanings as those generally understood by those skilled in the art. The terms used herein in the specification of the present disclosure are only for the purpose of describing specific embodiments, and are not intended to limit the present disclosure.

As shown in FIG. 1, in some embodiments of the present disclosure, the electronic device may include a shell 1a and a display 1b. The display 1b may be connected to the shell 1a. When the electronic device is in normal operation, the display 1b may display an image. An installation room (not shown) may be defined by the display 1b and the shell 1a. The electronic device may also include a circuit board (not shown). The circuit board may include a control circuit and may be configured to control the work of electronic device. The circuit board may be located in the installation room and electrically connected to the display 1b. The electronic device may be any device that can receive data from the outside and process the data. The electronic device may also be any device that has a battery inside and may acquire current from the outside to charge the battery. The electronic device may be, for example, a mobile phone, a tablet computer, a computing device, an information display device, and the like. In some embodiments, the electronic device may be a mobile phone. The shell 1a may be the back cover of the mobile phone. The display 1b may be firmly connected to the shell 1a.

Figure 2:
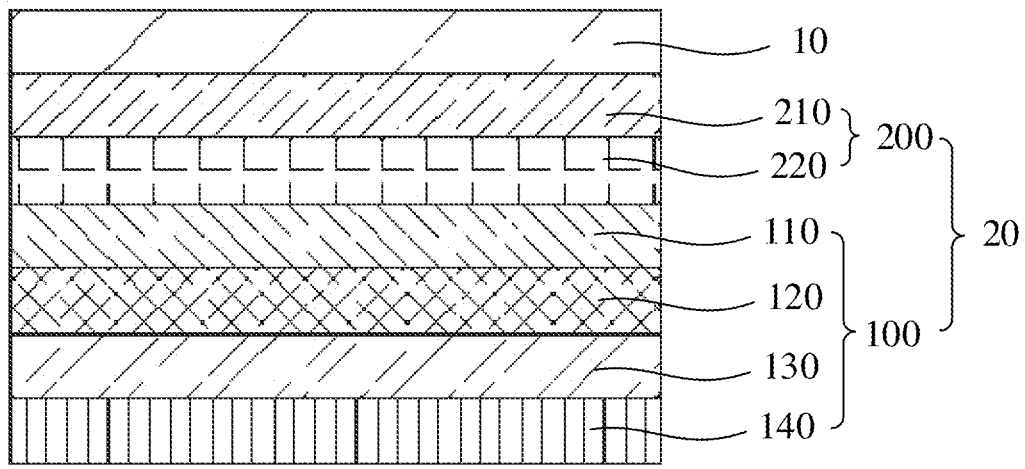
FIG. 2 is a cross sectional view of a shell as shown in FIG. 1.

As shown in FIG. 2, the shell 1a may include a substrate 10 and a membrane structure or film structure 20. The film structure 20 may be disposed on the substrate 10.

The substrate 10 may be a transparent glass plate. It should be noted that the substrate 10 may not be limited to the transparent glass plate, and may also be a transparent plastic plate.

In some embodiments, a thickness of the substrate 10 may be in a range from 0.5 cm to 0.7 cm.

The film structure 20 may include a first film assembly 100 and a second film assembly 200. The first film assembly 100 may include a first film 110 and a texture layer 120 stacked sequentially. The second film assembly 200 may include a second film 210 and a ribbon unit 220 disposed on the second film 210. The second film assembly 200 may be laminated or stacked on the first film assembly 100. The ribbon unit 220 may be disposed close to the first film 110. An orthographic projection of the ribbon unit 220 on a plane on which the texture layer 120 is located may fall on the texture layer 120.

In the film structure 20, the texture layer 120 may make the first film assembly 100 present a luminant pattern effect, and the ribbon unit 220 may have a high resolution such that the second film assembly 200 may present a fine color effect. The stacking of the ribbon unit 220 and the texture layer 120 makes the film structure 20 have color and luminant pattern with high resolution, and have a better appearance effect.

Figure 3:
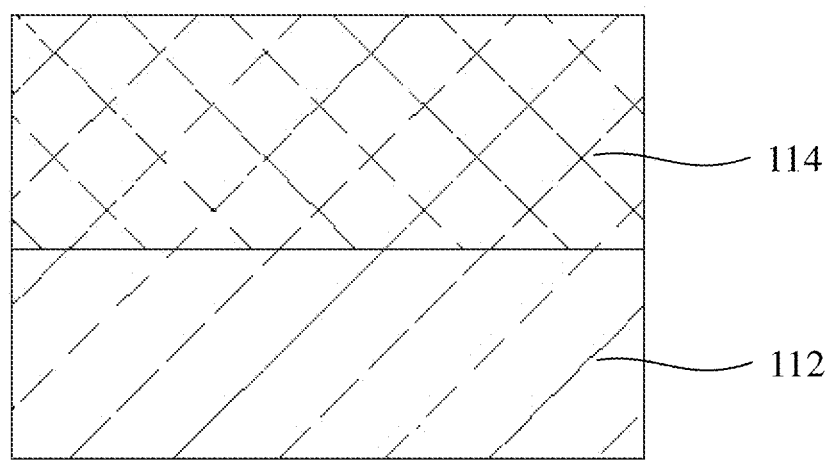
FIG. 3 is a cross sectional view of the first film of the shell as shown in FIG. 2.

As further shown in FIG. 3, the first film 110 may enhance the mechanical strength of the first film assembly 100. In some embodiments, the first film 110 may include a functional layer 112 and an adhesive layer 114 stacked on one another. The adhesive layer 114 may be disposed at one side of the functional layer 112 away from the texture layer 120. The adhesive layer 114 may make the first film 110 being cohesive and capable of bonding with other components.

Furthermore, the functional layer 112 may be a PET (polyethylene terephthalate) layer. The adhesive layer 114 may be made of OCA (optically clear adhesive). It should be noted that the functional layer 112 may not be limited to the materials described above, and may also be other materials. The material of the adhesive layer 114 may not be limited to the materials described above, and may also be other materials. In some embodiments, the first film 110 may be a strip-shaped.

In some embodiments, a thickness of the functional layer 112 may be in a range from 48 micrometers (μm) to 52 μm. A thickness of the adhesive layer 114 may be in a range from 20 μm to 30 μm. Furthermore, the thickness of the functional layer 112 may be 50 μm, and the thickness of the adhesive layer 114 may be 25 μm.

The texture layer 120 may have a refraction effect and a pattern effect, such that the first film assembly 100 may present a luminant pattern effect.

Figure 4:
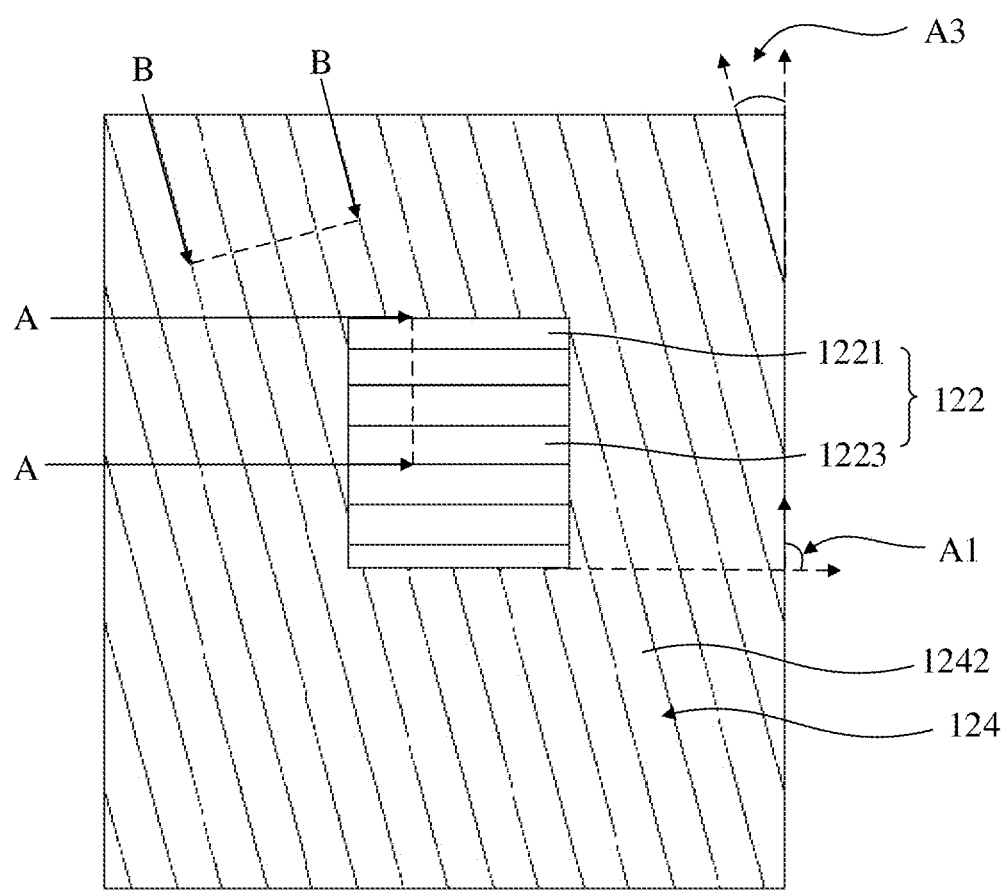
FIG. 4 is a structural view of a texture layer of the shell as shown in FIG. 2.
Figure 5:
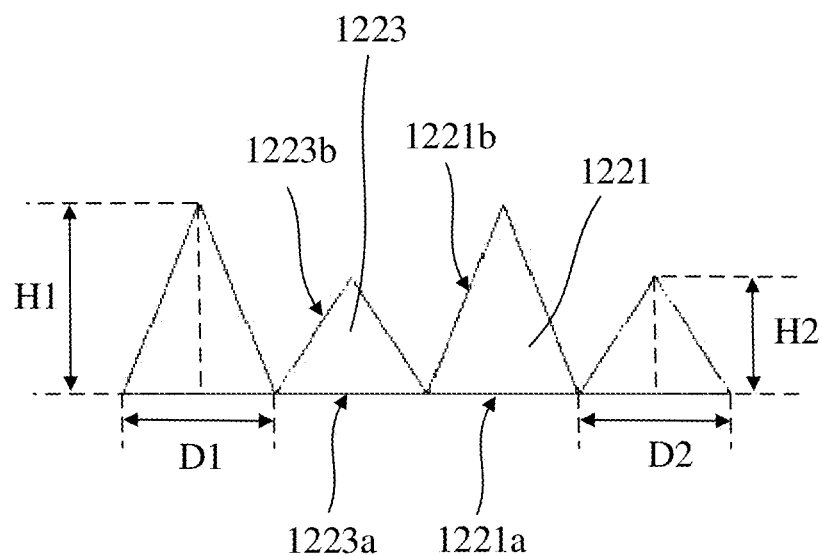
FIG. 5 is a cross sectional view of the texture layer of the shell as shown in FIG. 4 along line A-A.

As further shown in FIGS. 4 to 5, the texture layer 120 may be at least coated on partial surface of the first film 110 close to the texture layer 120. The texture layer 120 may include a first texture area 122. A plurality of first convex bars 1221 parallel with each other and a plurality of second convex bars 1223 parallel with each other may be disposed in the first texture area 122. The plurality of first convex bars 1221 and the plurality of second convex bars 1223 may be alternately arranged. A height of each second convex bar 1223 may be less than a height of each first convex bar 1221. Due to the height difference between the second convex bar 1223 and the first convex bar 1221, the light refraction and reflection of the texture layer 120 may be increased, such that the texture layer 120 may have a high luminance in the first texture area 122.

Furthermore, the texture layer 120 may be coated on entire surface of the first film 110 close to the texture layer 120. Thus, one surface of the shell 1a away from the substrate 10 may present the texture effect on entire surface.

In some embodiments, adjacent first convex bars 1221 and second convex bars 1223 may be located without a gap. Thus, the texture effect of the texture layer 120 in the first texture area 122 may be improved, such that the part of the texture layer 120 in the first texture area 122 may present the luminant effect on entire surface.

In some embodiments, a cross section of each first convex bar 1221 along a direction perpendicular to an extension direction of the first convex bar 1221 may be in shape of a triangle. Furthermore, the cross section of each first convex bar 1221 along the direction perpendicular to the extension direction of the first convex bar 1221 may be in shape of an isosceles triangle. Thus, the texture layer 120 may have a depth sense in the first texture area 122. Furthermore, the cross section of each first convex bar 1221 along the direction perpendicular to the extension direction of the first convex bar 1221 may be in shape of an equilateral triangle.

In some embodiments, a cross section of each second convex bar 1223 along the direction perpendicular to an extension direction of the second convex bar 1223 may be in shape of a triangle. Furthermore, the cross section of each second convex bar 1223 along the direction perpendicular to the extension direction of the second convex bar 1223 may be in shape of an isosceles triangle. Thus, the texture layer 120 may have a depth sense in the first texture area 122. Furthermore, the cross section of each second convex bar 1223 along the direction perpendicular to the extension direction of the second convex bar 1223 may be in shape of an equilateral triangle.

In some embodiments, the height difference between the first convex bar 1221 and the second convex bar 1223 may be in a range from 2 μm to 4 μm. The height of each first convex bar 1221 may be a distance from the surface of the first convex bar 1221 away from the first film 110 to the surface of the functional layer 112 away from the adhesive layer 114. The height of the first convex bar 1221 may be defined as H1. The height of the second convex bar 1223 may be a distance from the surface of the second convex bar 1223 away from the first film 110 to the surface of the functional layer 112 away from the adhesive layer 114. The height of the second convex bar 1223 may be defined as H2. In some embodiments, H1 may be in a range from 8 μm to 10 μm, and H2 may be in a range from 5 μm to 7 μm.

In some embodiments, a width of the first convex bar 1221 may be substantially equal to a width of the second convex bar 1223. Thus, the texture layer 120 may present a uniform luminance effect. The width of the first convex bar 1221 may be defined as D1. The width of the second convex bar 1223 may be defined as D2. In some embodiments, D1 may be in a range from 6 μm to 10 μm, and D2 may be in a range from 6 μm to 10 μm.

In some embodiments, each first convex bar 1221 may be in shape of a triangular prism. One side surface of each first convex bar 1221 may face the first film 110. Each second convex bar 1223 may be in shape of a triangular prism. One side surface of each second convex bar 1223 may face the first film 110. In some embodiments, each first convex bar 1221 may have a first side surface 1221a and two second side surfaces 1221b. The first side surface 1221a may face the first film 110. An angle between one of the two second side surfaces 1221b and the first side surface 1221a may be substantially equal to an angle between the other one of the two second side surfaces 1221b and the first side surface 1221a. The first convex bar 1221 may be substantially parallel to the second convex bar 1223. Each second convex bar 1223 may have a third side surface 1223a and two fourth side surfaces 1223b. The third side surface 1223a may face the first film 110. An angle between one of the two fourth side surfaces 1223b and the third side surface 1223a may be substantially equal to an angle between the other one of the two fourth side surfaces 1223b and the third side surface 1223a. A distance from an intersection line of the two second side surfaces 1221b to the first side surface 1221a may be greater than a distance from an intersection line of the two fourth side surfaces 1223b to the third side surface 1223a.

Thus, the light reflection of the texture layer 120 may be improved by the height difference between the first convex bar 1221 and the second convex bar 1223, such that the luminance of the texture layer 120 in the first texture area 122 may be strengthened and the texture layer 120 may present luminant pattern only on partial area.

The distance from the intersection line of the two second side surfaces 1221b to the first side surface 1221a may be the distance H1, and the distance from the intersection line of the two fourth side surfaces 1223b to the third side surface 1223a may be the distance H2. Furthermore, H1 may be greater than H2. The difference between H1 and H2 may be in a range from 2 μm to 4 μm. Thus, the luminance of the texture layer 120 in the first texture area 122 may be higher than other areas, and the texture layer 120 may present luminant pattern on partial area. In some embodiments, the width of the first side surface 1221a may be substantially equal to the width of the third side surface 1223a. The width of the first side surface 1221a may be the width D1. The width of the third side surface 1223a may be the width D2.

The angle between the extension direction of the first convex bar 1221 and the extension direction of the first film 110 may be defined as A1. In some embodiments, A1 may be in a range from 85 degrees to 95 degrees. Thus, the luminance of the first texture area 122 may be further enhanced when the texture layer 120 may be viewed along a direction perpendicular to the extension direction of the first film 110. In some embodiments, A1 may be 90 degrees. It should be noted that A1 may not be limited to the angle range above and may be selected as required.

In some embodiments, an outline of the first texture area 122 may be in shape of a person. The person may be a character in Chinese novel Water Margin or other artists. It should be noted that the outline of the first texture area 122 may not be limited to the person, and may also be the animal, such as the Chinese zodiac. The outline of the first texture area 122 may be selected as required.

In some embodiments, the number of the first texture area 122 may be one.

Figure 6:
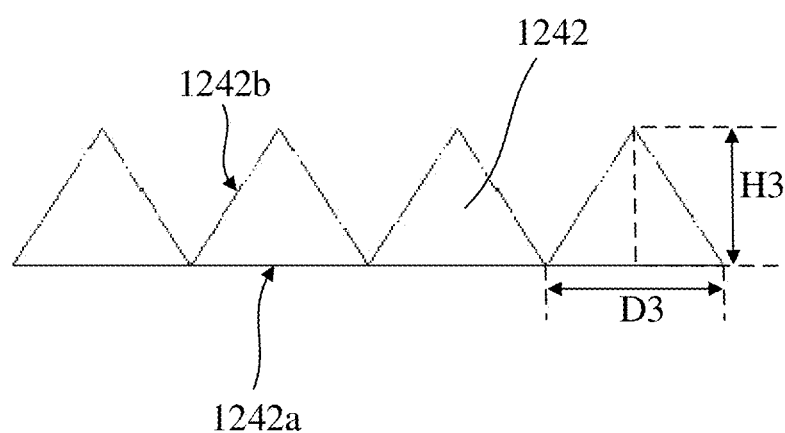
FIG. 6 is a cross sectional view of the texture layer of the shell as shown in FIG. 4 along line B-B.

As further shown in FIG. 6, in some embodiments, the texture layer 120 may also include a second texture area 124. A plurality of third convex bars 1242 parallel to each other may be disposed in the second texture area 124. Thus, the second texture area 124 may also present luminance effect. Furthermore, the second texture area 124 and the first texture area 122 may be arranged without a gap.

In some embodiments, the cross section of each third convex bar 1242 along the direction perpendicular to the extension direction of the third convex bar 1242 may be in shape of an isosceles triangle. Furthermore, the cross section of each third convex bar 1242 along the direction perpendicular to the extension direction of the third convex bar 1242 may be in shape of an equilateral triangle. Thus, the second texture area 124 may also present luminance effect. The luminance effect of the second texture area 124 may be different from the luminance effect of the first texture area 122, such that different areas of the film structure 20 may have different luminance effects, and the texture layer 120 may present luminant pattern on partial area.

In some embodiments, the height of the third convex bar 1242 may be defined as H3. H3 may be in a range from 5 µm to 6 µm. Thus, the depth sense of the second texture area 124 may be stronger.

In some embodiments, the width of the third convex bar 1242 may be defined as D3. D3 may be in a range from 6 µm to 10 µm. Thus, the depth sense of the second texture area 124 may be stronger.

In some embodiments, the height of the third convex bar 1242 may be substantially equal to the height of the second convex bar 1223. Thus, the second texture area 124 may also present luminance effect. The luminance effect of the second texture area 124 may be different from the luminance effect of the first texture area 122, such that different areas of the film structure 20 may have different luminance effects, and the texture layer 120 may present luminant pattern on partial area. Furthermore, the width of the third convex bar 1242 may be substantially equal to the width of the second convex bar 1223. Thus, the depth sense of the second texture area 124 may be stronger. It should be noted that D3 may not be limited to be the same as D2, and D3 may be smaller or greater than D2. H3 may not be limited to equal to H2, and H3 may also be smaller than or greater than H2. D3 and H3 may be selected as required.

In some embodiments, the third convex bar 1242 may be triangular prism. One side surface of one of the third convex bars 1242 may face the first film 110. In some embodiments, the third convex bar 1242 may include a fifth side surface 1242a and two sixth side surfaces 1242b. The fifth side surface 1242a may face the first film 110. An angle between one of the two sixth side surfaces 1242b and the fifth side surface 1242a may be substantially equal to an angle between the other one of the two sixth side surfaces 1242b and the fifth side surface 1242a. A distance from an intersection line of the two sixth side surfaces 1242b to the fifth side surface 1242a may be the height H3. The width of the fifth side surface 1242a may be the width D3.

In some embodiments, an extension line of the third convex bar 1242 may intersect with an extension line of the first convex bar 1221. Thus, the luminance of the first texture area 122 may be different from the luminance of the second texture area 124 when the texture layer 120 is viewed along the same direction. Furthermore, an angle between an extension direction of the third convex bar 1242 and an extension direction of the first film 110 may be defined as A3. A3 may be in a range from 25 degrees to 35 degrees. Thus, it is possible to reduce the possibility of generating Moire in the second texture area 124. In some embodiments, A3 may be 30 degrees. It should be noted that A3 may not be limited to the angle range above, and may also be selected as required.

In some embodiments, the second texture area 124 may be designed as a changeable prototype. The changeable prototype may include changeable patterns. Furthermore, an outline of the second texture area 124 may be in shape of a totem. It should be noted that the outline of the second texture area 124 may not be limited to the shape of totem, and may also be in the shape of a person or an animal, such as Chinese zodiac. The outline of the second texture area 124 may be selected as required.

In some embodiments, the number of the second texture area 124 may be one. The second texture area 124 may be arranged around the first texture area 122.

In some embodiments, the texture layer 120 may be formed or disposed on the first film 110 by ultraviolet (UV) transfer printing. Furthermore, the UV glue with light curing property may be used to transfer the texture of the designed mold to the first film 110, in order to form the texture layer 120 on the first film 110.

Figure 7:
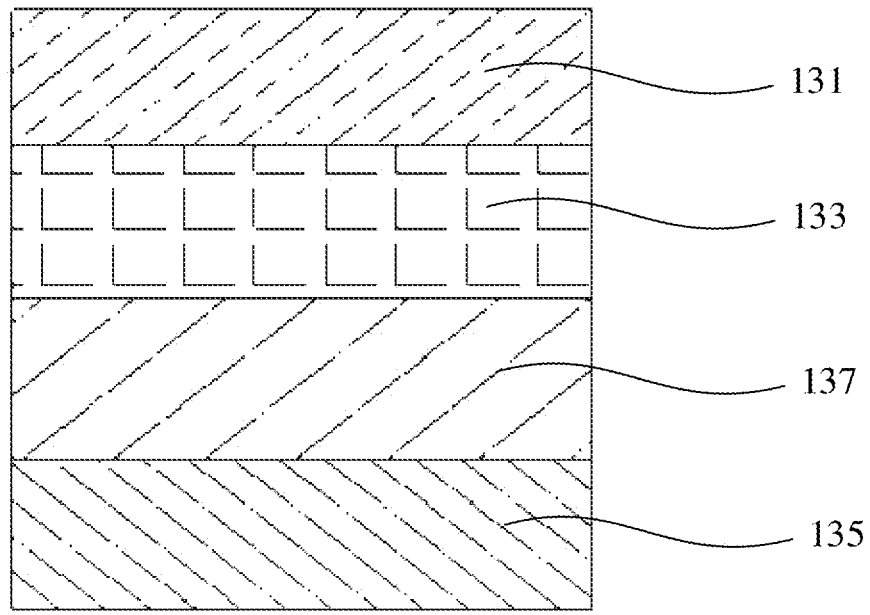
FIG. 7 is a cross sectional view of a reflection unit of the shell as shown in FIG. 2.

As further shown in FIG. 2 and FIG. 7, in some embodiments, the first film assembly 100 may also include a reflection unit 130. The reflection unit 130 may be coated on a surface of the texture layer 120 away from the first film 110. Furthermore, the reflection unit 130 may include an attaching layer 131, a first refraction layer 133, and a second refraction layer 135. The attaching layer 131 may be disposed at one side of the texture layer 120 away from the first film 110. The first refraction layer 133 may be disposed at one side of the attaching layer 131 away from the texture layer 120, and the second refraction layer 135 may be disposed at one side of the first refraction layer 133 away from the attaching layer 131. A refractive index of the second refraction layer 135 may be greater than a refractive index of the first refraction layer 133.

The reflection unit 130 may be firmly attached to the texture layer 120 with the attaching layer 131. The combination of the first refraction layer 133 and the second refraction layer 135 makes the reflection unit 130 has a reflection effect to reflect light onto the first film 110, such that the luminance of the texture layer 120 may be increased.

In some embodiments, the refractive index of the first refraction layer 133 may be in a range from 0.68 to 0.72. The refractive index of the second refraction layer 135 may be in a range from 2.55 to 2.76. Thus, the reflection of the reflection unit 130 to the light may be improved, and the luminance of the first film assembly 100 may be increased. Furthermore, the first refraction layer 133 may be an indium layer. The second refraction layer 135 may be a titanium dioxide layer, a trititanium pentoxide layer or a niobium pentoxide layer. Thus, the reflection of the reflection unit 130 may be further improved.

In some embodiments, the attaching layer 131 may be an alumina layer or a silicon dioxide layer. Thus, the adhesion of the reflection unit 130 may be improved, and the structural stability of the first film assembly 100 may be achieved.

In some embodiments, the reflection unit 130 may also include an interlayer 137. The interlayer 137 may be disposed between the first refraction layer 133 and the second refraction layer 135. The interlayer 137 may be an alumina layer or a silicon dioxide layer. The combination of the interlayer 137 and the attaching layer 131 may protect the first refraction layer 133 and reduce the oxidation of the first refraction layer 133.

In some embodiments, the attaching layer 131 may be an alumina layer, and a thickness of the attaching layer 131 may be in a range from 30 nm to 40 nm. The first refraction layer 133 may be an indium layer, and a thickness of the first refraction layer 133 may be in a range from 10 nm to 30 nm. The interlayer 137 may be an alumina layer, and a thickness of the interlayer 137 may be in a range from 30 nm to 40 nm. The second refraction layer 135 may be a titanium dioxide layer, and a thickness of the second refraction layer 135 may be in a range from 3 nm to 7 nm. It should be noted that the thicker the first refraction layer 133 is, the better the reflection of the reflection unit 130 is, and the higher the luminance of the texture layer 120 is. However, the thicker the first refraction layer 133 is, the easier the first refraction layer 133 is to be oxidized. The first refraction layer 133 may ensure the luminance effect of the reflection unit 130, and may also reduce the oxidation of the first refraction layer 133.

Furthermore, the thickness of the first refraction layer 133 may be in a range from 10 nm to 20 nm. Thus, the luminance effect of the reflection unit 130 may be achieved surely, the first refraction layer 133 may be protected, and the oxidation of the first refraction layer 133 may also be reduced.

In some embodiments, the reflection unit 130 may be formed or disposed on the texture layer 120 by electronic evaporation. It should be noted that the method for forming the reflection unit 130 on the texture layer 120 may not be limited to the method above, and may also be other coating methods, such as magnetron sputtering.

In some embodiments, the first film assembly 100 further may include an ink layer 140. The ink layer 140 may be coated at one side of the reflection unit 130 away from the texture layer 120. The ink layer 140 may be configured to prevent the light in the first film assembly 100 from passing through the ink layer 140, such that the texture layer 120 may appear.

In some embodiments, a thickness of the ink layer 140 may be in a range from 5 μm to 24 μm. Thus, the light may be prevented effectively from passing through the ink layer 140, such that light in the second film assembly 200 may be reflected by the reflection unit 130 or absorbed by the ink layer 140.

In some embodiments, the ink layer 140 may be formed on the texture layer 120 by a screen printing process. Furthermore, the ink layer 140 may be formed by repeatedly printing ink materials on the texture layer 120 by the screen printing process. Specifically, the ink layer 140 may be formed by repeatedly printing ink materials for three times. A thickness of the ink materials printed each time may be in a range from 5 μm to 8 μm. It should be noted that the number of times of printing may not be limited to three times, and may be selected as required, such as twice or four times. The ink material may be low temperature ink. The low temperature ink may be the ink that may get dry at a lower temperature, such as a temperature from 80° C. to 90° C.

Figure 8:
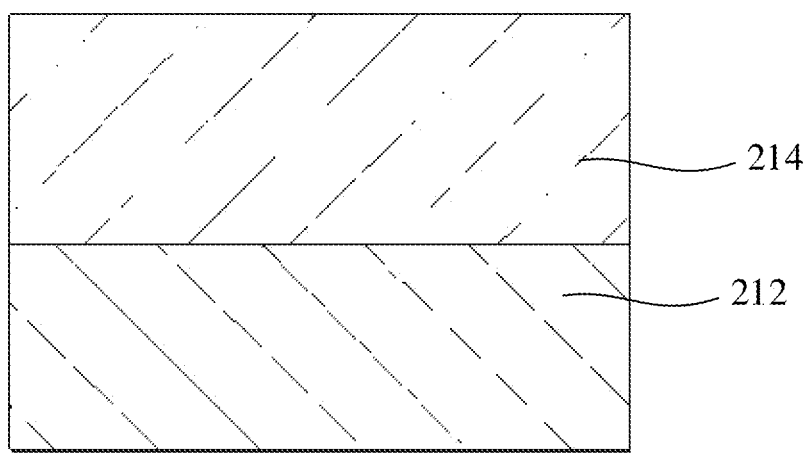
FIG. 8 is a cross sectional view of the second film of the shell as shown in FIG. 2.

As further shown in FIG. 8, the second film 210 may enhance the mechanical strength of the second film assembly 200. In some embodiments, the second film 210 may include an explosion-proof layer 212 and a bonding layer 214 stacked on one another. The bonding layer 214 may be disposed at one side of the explosion-proof layer 212 away from the ribbon unit 220. The bonding layer 214 makes the second film 210 being cohesive and capable of bonding with other components. Furthermore, the explosion-proof layer 212 may be a PET layer. The material of bonding layer 214 may be OCA. It should be noted that the explosion-proof layer 212 may not be limited to the materials above, and may also be other materials. The material of the bonding layer 214 may not be limited to the material above, and may also be other materials. In some embodiments, the second film 210 may be a strip-shaped.

In some embodiments, an extension direction of the second film 210 may be parallel to an extension direction of the first film 110.

In some embodiments, a thickness of the explosion-proof layer 212 may be in a range from 21 μm to 25 μm. A thickness of the bonding layer 214 may be in a range from 15 μm to 25 μm. Furthermore, the thickness of the explosion-proof layer 212 may be 23 μm. The thickness of bonding layer 214 may be 15 μm.

The stacking of the ribbon unit 220 and the texture layer 120 makes the film structure 20 present a luminant pattern effect, the resolution of the pattern may be higher, and the color saturation of the pattern may be higher.

Figure 9:
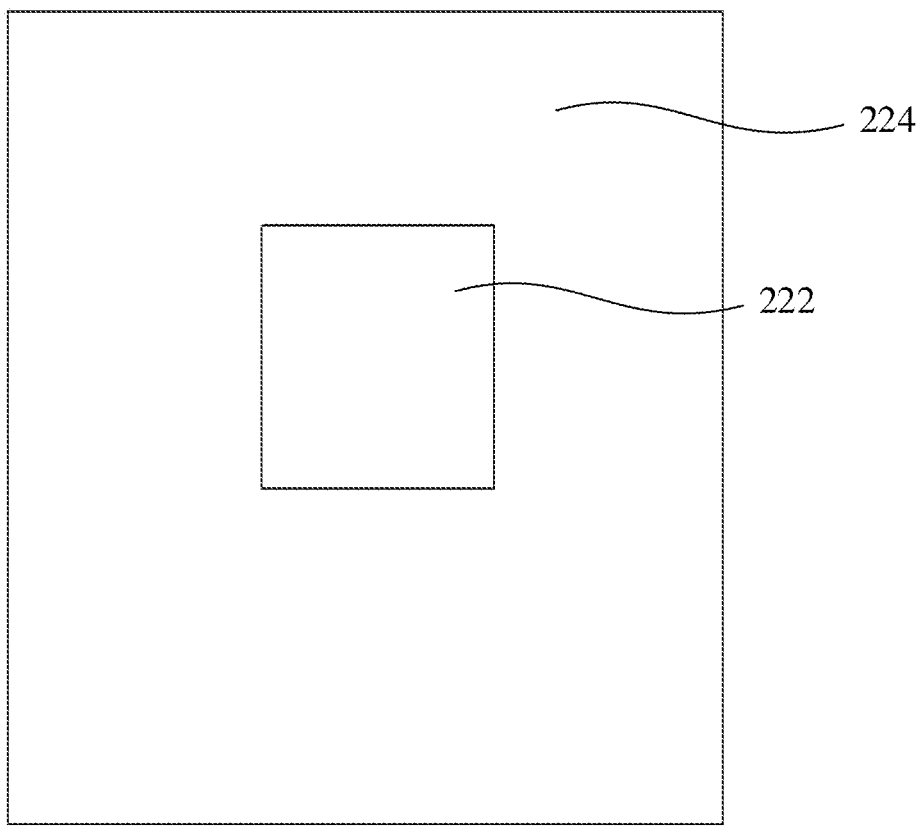
FIG. 9 is a structural view of the second film and a ribbon unit of the shell as shown in FIG. 2.

As further shown in FIG. 9, in some embodiments, the ribbon unit 220 may have a first ribbon area 222. A position of the first ribbon area 222 may correspond to a position of the first texture area 122. An orthographic projection of the first ribbon area 222 on a plane on which the first texture area 122 is located may fall in the first texture area 122. Thus, a part of the film structure 20 at the first texture area 122 may have a color and luminant pattern effect, and a high resolution.

In some embodiments, an outline of the orthographic projection of the first ribbon area 222 on the first texture area 122 (that is, the orthographic projection of the first ribbon area 222 projected on a plane on which the first texture area 122 is located) may be consistent with an outline of the first texture area 122. Thus, the appearance of the film structure 20 may be improved.

In some embodiments, the orthographic projection of the first ribbon area 222 on a plane on which the first texture area 122 is located may fall within the first texture area 122. Thus, all the patterns corresponding to the first ribbon area 222 may be luminant. Furthermore, the distance between an edge of the orthographic projection of the first ribbon area 222 on the first texture area 122 and an edge of the first texture area 122 may be greater than 0.2 millimeters (mm). Thus, the film structure 20 may present texture and fine color in the area in which the first texture area 122 and the first ribbon area 222 are overlapped with each other, and the film structure 20 also presents fine color in the area in which the first texture area 122 and the first ribbon area 222 are not overlapped with each other. Furthermore, the distance between the edge of the orthographic projection of the first ribbon area 222 on a plane on which the first texture area 122 is located and the edge of the texture layer 120 may be in a range from 0.2 mm to 0.3 mm.

In some embodiments, the number of the first ribbon area 222 may be one. The orthographic projection of the first ribbon area 222 on a plane on which the first texture area 122 is located may coincide with the first texture area 122 completely.

It should be noted that the orthographic projection of the first ribbon area 222 on the first film 110 may not be limited to falling within the first texture area 122, and the orthographic projection of the first ribbon area 222 on the first film 110 may also completely cover or beyond the first texture area 122. Thus, the film structure 20 may present texture and fine color in the area in which the first texture area 122 and the first ribbon area 222 are overlapped with each other, and the film structure 20 may also present texture in the area in which the first texture area 122 and the first ribbon area 222 are not overlapped with each other.

Figure 10:
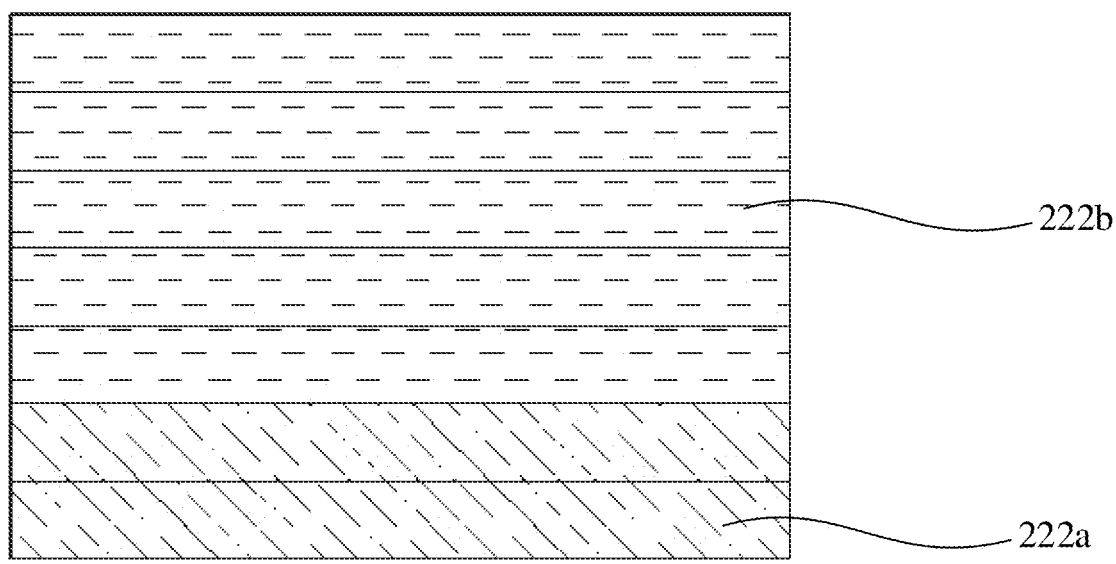
FIG. 10 is a cross sectional view of the ribbon unit as shown in FIG. 9 in the first ribbon area.

As further shown in FIG. 10, in some embodiments, the ribbon unit 220 may have a first monochrome layer 222a and a gradient color layer 222b in the first ribbon area 222. The first monochrome layer 222a may be located close to or adjacent to the second film 210. The gradient color layer 222b may be disposed at one side of the first monochrome layer 222a away from the second film 210. Thus, the ribbon unit 220 may be more colorful in the first ribbon area 222.

In some embodiments, the ribbon of the ribbon unit 220 in the first ribbon area 222 may be the ribbon of the CMYK. Herein, C is cyan, M is magenta, Y is yellow, and K is black.

Furthermore, the ribbon of the first monochrome layer 222a may be cyan or magenta. The ribbon of the gradient color layer 222b may include at least one of the cyan, yellow, and magenta. It should be noted that the ribbon of the first monochrome layer 222a may not be limited to the ribbon above, and may also be the ribbon of other colors selected as required. The ribbon of the gradient color layer 222b may not be limited to the ribbon above, and may also be the ribbon of other colors selected as required.

In some embodiments, a plurality of first monochrome layers 222a are provided. The plurality of first monochrome layers 222a may be stacked on one another sequentially and located between the second film 210 and the gradient color layer 222b.

In some embodiments, a plurality of gradient color layers 222b are provided. The plurality of gradient color layers 222b may be stacked on one another sequentially and disposed at one side of the first monochrome layer 222a away from the second film 210.

In some embodiments, a plurality of first monochrome layers 222a may be provided, and the plurality of first monochrome layers 222a may be stacked on one another. A plurality of gradient color layers 222b may be provided, and the plurality of gradient color layers 222b may be disposed on one of the plurality of first monochrome layers 222a farthest away from the second film 210, such that all the first monochrome layers 222a may be located between the second film 210 and one of the plurality of gradient color layers 222b closest to the second film 210.

In some embodiments, the number of the first monochrome layers 222a may be two. Two first monochrome layers 222a may be successively stacked on the second film 210. The number of the gradient color layers 222b may be five. Five gradient color layers 222b may be successively stacked on the first monochrome layer 222a farthest away from the second film 210. Thus, the ribbon unit 220 may be more colorful in the first ribbon area 222.

It should be noted that the number of the first monochrome layer 222a may not be limited to two, and may be selected as required, such as one or three. It should be noted that the number of the gradient color layers 222b may not be limited to five layers, and may be selected as required, such as one or three.

In some embodiments, the ribbon unit 220 may include a second ribbon area 224. The position of the second ribbon area 224 may correspond to the position of the second texture area 124. An orthographic projection of the second ribbon area 224 projected on a plane on which the second texture area 124 is located may fall in the second texture area 124. Furthermore, the second ribbon area 224 and the first ribbon area 222 may be arranged without a gap.

Furthermore, am outline of the orthographic projection of the second ribbon area 224 projected on a plane on which the second texture area 124 is located may be consistent with an outline of the second texture area 124. Thus, the appearance of the film structure 20 may be improved.

In some embodiments, the orthographic projection of the second ribbon area 224 on a plane on which the second texture area 124 is located may fall within the second texture area 124. Thus, all the patterns corresponding to the second ribbon area 224 may present luminant effect. Furthermore, the distance between the edge of the orthographic projection of the second ribbon area 224 on a plane on which the second texture area 124 is located and the edge of the second texture area 124 may be greater than 0.2 mm. Thus, the film structure 20 may present the texture and fine color in the area in which the second ribbon area 224 and the second texture area 124 are overlapped with each other, and the film structure 20 may present the fine color in the area in which the second ribbon area 224 and the second texture area 124 are not overlapped with each other. Furthermore, the distance between the edge of the orthographic projection of the second ribbon area 224 on a plane on which the second texture area 124 is located and the edge of the second texture area 124 may be in a range from 0.2 mm to 0.3 mm.

In some embodiments, the number of the second ribbon area 224 may be one. The orthographic projection of the second ribbon area 224 on a plane on which the second texture area 124 is located may coincide with the second texture area 124 completely.

It should be noted that the orthographic projection of the second ribbon area 224 on a plane on which the second texture area 124 is located may not be limited to falling within the second texture area 124, and the orthographic projection of the second ribbon area 224 on a plane on which the second texture area 124 is located may also completely cover or beyond the second texture area 124. Thus, the film structure 20 may present the texture and fine color in the area in which the second ribbon area 224 and the second texture area 124 are overlapped with each other, and the film structure 20 may also present the fine color in the area in which the second ribbon area 224 and the second texture area 124 are not overlapped with each other.

Figure 11:
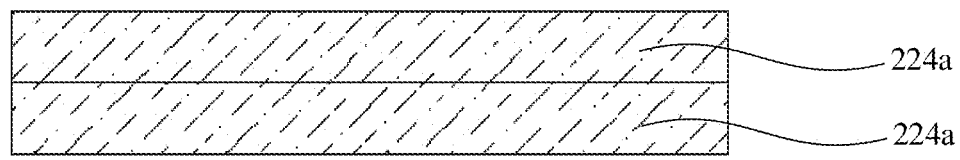
FIG. 11 is a cross sectional view of the ribbon unit as shown in FIG. 9 in the second ribbon area.

As further shown in FIG. 11, in some embodiments, the ribbon unit 220 may include a plurality of second monochrome layers 224a in the second ribbon area 224. The plurality of second monochrome layers 224a may be stacked on the second film 210 sequentially. Thus, there may be a contrast between the color of the pattern corresponding to the second ribbon area 224 and the color of the pattern corresponding to the first ribbon area 222, such that the color of the pattern corresponding to the first ribbon area 222 may be further highlighted, and thus the film structure 20 may present different colors in different areas of the film structure 20.

In tone embodiment, the number of the second monochrome layer 224a may be two. Two second monochrome layers 224a may be successively disposed on the second film 210. It should be noted that the number of the second monochrome layers 224a may not be limited to two, and may be selected as required, such as one or three.

In some embodiments, the ribbon of the ribbon unit 220 in the second ribbon area 224 may be the ribbon of a CMYK color system.

Furthermore, the ribbon of the second monochrome layer 224a may be a cyan ribbon or a magenta ribbon. It should be noted that the ribbon of the second monochrome layer 224a may not be limited to the ribbons above, and may also be other ribbons selected as required.

In some embodiments, the first film assembly 100 may include a first alignment part. The second film assembly 200 may include a second alignment part corresponding to the first alignment part. The first alignment part may be aligned with the second alignment part, such that the first film assembly 100 and the second film assembly 200 may be laminated or attached to each other accurately, and the orthographic projection of the ribbon unit 220 on a plane on which the texture layer 120 is located may fall in the texture layer 120. The first alignment part may be an alignment line. The second alignment part may be an alignment line. The first alignment part and the second alignment part may be overlapped with each other, such that the first film assembly 100 and the second film assembly 200 may be laminated or attached to each other accurately.

In one of the embodiments, the ribbon unit 220 may be formed on the second film 210 by the color-band transfer-printing process. Furthermore, the temperature for transfer printing may be from 60° C. to 70° C.

The film structure 20 may be disposed on the substrate 10. A side of the second film 210 at which the second film 210 is located may face towards the substrate 10. That is to say, the second film 210 is disposed adjacent to the substrate 10. In some embodiments, the second film 210 may be bonded to the substrate 10 by the bonding layer 214.

In the film structure 20 of the shell 1a, the texture layer 120 may make the first film assembly 100 present a luminant pattern effect and make the ribbon unit 220 has a high resolution, such that the second film assembly 200 may present a fine color effect. The combination of the ribbon unit 220 and the texture layer 120 makes the film structure 20 have color and luminant pattern with high resolution. The pattern effect may be abundant, and the shell 1a may have good appearance.

Furthermore, in the film structure 20 of the shell 1a, a height of the first convex bar 1221 may be greater than a height of the second convex bar 1223. Thus, the pattern of the film structure 20 in the first texture area 122 may be more prominent, and the brightening effect of the film structure 20 in the first texture area 122 may be better than the brightening effect of the film structure 20 in the second texture area 124. In this way, different areas of the film structure 20 may have different luminantnes, and the film structure 20 may present luminant pattern on partial area.

Furthermore, in the film layer structure 20 of the shell 1a, the ribbon unit 220 may include the first monochrome layer 222a and the gradient color layer 222b successively stacked in the first ribbon area 222. The ribbon unit 220 may include a plurality of second monochrome layers 224a in the second ribbon area 224. Thus, there may be a contrast between the color of the pattern corresponding to the second ribbon area 224 and the color of the pattern corresponding to the first ribbon area 222, such that the color of the pattern corresponding to the first ribbon area 222 may be further highlighted, and the film layer structure 20 may present different colors in different areas.

In conclusion, the shell 1a may include a film structure 20 with color and luminant pattern. The film structure 20 has good appearance and small thickness. Thus, the shell 1a may be used in the electronic device requiring good appearance. For example, the shell 1a may be a back cover of a mobile phone with 3D radian less than 4.0 mm.

The texture layer 120 may not be limited to the above structure, and may also be other structure, as long as the film structure 20 has a texture effect.

In some embodiments, the second texture area 124 and the second ribbon area 224 may be omitted. In this structure, the stacking of the first texture area 122 and the first ribbon area 222 may make the film structure 20 present color and luminant pattern effect.

In some embodiments, the first texture area 122 and the first ribbon area 222 may be omitted. In this structure, the film structure 20 may present a luminant pattern effect in the second texture area 124.

In some embodiments, the ink layer 140 may be omitted. In this structure, the structure of the display 1b and the circuit board may be viewed through the shell 1a.

In some embodiments, the reflection unit 130 may also be omitted. In this structure, the ink layer 140 may be directly coated on the texture layer 120.

Figure 12:
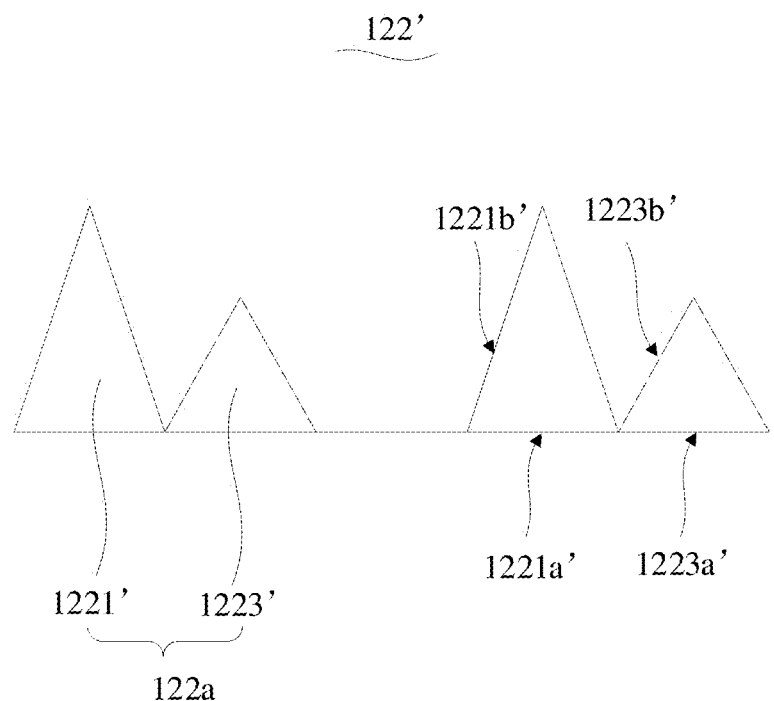
FIG. 12 is a cross sectional view of a texture layer in the first texture area according to some embodiments of the present disclosure.

In some embodiments, the first convex bar 1221 and the second convex bar 1223 adjacent to each other may not be limited to be arranged gaplessly or without a gap, and the first convex bar 1221 and the second convex bar 1223 adjacent to each other may also be spaced apart from each other. The first texture area 122 may not be limited to the above structure, and may also have other structures. For example, as further shown in FIG. 12, the structure of the first texture area 122' according to some embodiments of the present disclosure may be provided and similar as the structure of the first texture area 122 described above, except that the first texture area 122' has a plurality of convex bar groups 122a. Each convex bar group 122a may include a first convex bar 1221' and a second convex bar 1223' parallel to and spliced with each other. A height of each first convex bar 1221' may be greater than a height of the second convex bar 1223'.

In some embodiments, the first convex bar 1221' may be in shape of a triangular prism. The second convex bar 1223' may be in shape of a triangular prism. The first convex bar 1221' may have a first side surface 1221a' and a pair of second side surfaces 1221b'. The first side surface 1221a' may face the first film 110. An angle between one of the two second side surfaces 1221b' and the first side surface 1221a' may be substantially equal to an angle between the other one of the two second side surfaces 1221b' and the first side surface 1221a'. The second convex bar 1223' may have a third side surface 1223a' and two fourth side surfaces 1223b'. The third side surface 1223a' may face the first film 110. An angle between one of the two fourth side surfaces 1223b' and the third side surface 1223a' may be substantially equal to the angle between the other one of the two fourth side surfaces 1223b' and the third side surface 1223a'. A distance from an intersection line of the two second side surfaces 1221b' to the first side surface 1221a' may be greater than a distance from an intersection line of the two fourth side surfaces 1223b' to the third side surface 1223a'.

In some embodiments, the plurality of convex bar groups 122a may be spaced apart from each other. The plurality of first convex bars 1221' of each convex bar group 122a may be parallel to each other.

In some embodiments, the plurality of convex bar groups 122a may be spaced apart from each other along a direction perpendicular to an extension direction of the first convex bar 1221'.

Furthermore, each convex bar group 122a may include a plurality of first convex bars 1221' and a plurality of second convex bars 1223', and the plurality of first convex bars 1221' and the plurality of second convex bars 1223' may be alternately arranged. It should be noted that the number of the first convex bar 1221' and the number of the second convex bar 1223' in each convex bar group 122a may be two or three, and may be selected as required. It should be noted that the number of the first convex bar 1221' and the number of the second convex bar 1223' in each convex bar group 122a may be the same as or different from each other, and may be selected as required.

The first texture area 122' may make the first film assembly 100 present a luminant pattern effect, and may make the film structure 20 have color and luminant pattern with high resolution by cooperating with the ribbon unit 220. Thus, the shell 1a has a good appearance.

Figure 13:
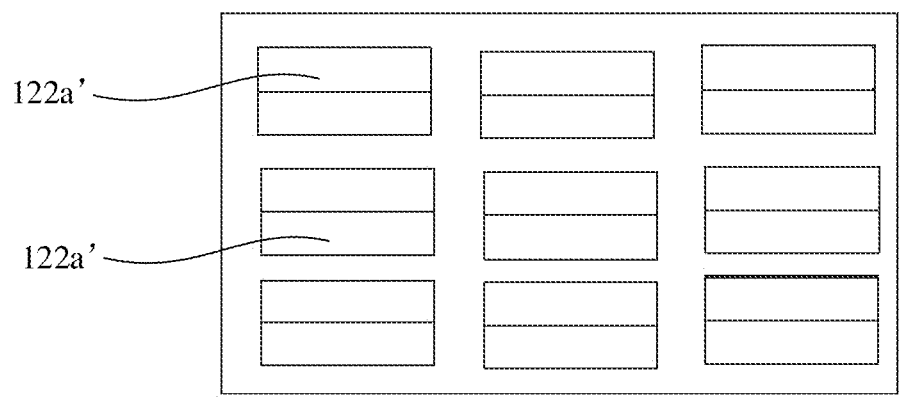
FIG. 13 is a schematic view of the arrangement of a plurality of convex bar groups according to some embodiments of the present disclosure.

It should be noted that the plurality of convex bar groups 122a may not be limited to the above arrangement, and may also be other arrangements. As shown in FIG. 13, the plurality of convex bar groups 122a' may also be arranged in an array.

It can be understood that, the shape of the first convex bar 1221 and the second convex bar 1223 may not be limited to the triangular prism. The first convex bar 1221 and the second convex bar 1223 may also be in other shapes, such as a fold line, a wave line, an arc, and the like.

It can be understood that, the shape of the third convex bar 1242 may not be limited to the triangular prism. The third convex bar 1242 may also be in other shapes, such as a fold line, a wave line, an arc, and the like.

Figure 14:
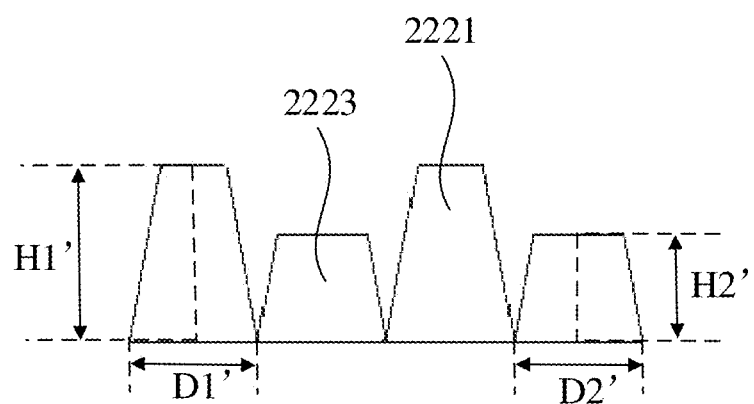
FIG. 14 is a cross sectional view of a texture layer in the first texture area according to some embodiments of the present disclosure.

It can be understood that, the shape of the cross section of each first convex bar 1221 in the direction perpendicular to the extension direction of the first convex bar 1221 may not be limited to a triangle. The shape of the cross section of each second convex bar 1223 in the direction perpendicular to the extension direction of the second convex bar 1223 may not be limited to a triangle. As shown in FIG. 14, the shape of the cross section of the first convex bar 2221 in the direction perpendicular to the extension direction of the first convex bar 2221 may be a trapezoid, and the shape of the cross section of the second convex bar 2223 in the direction perpendicular to the extension direction of the second convex bar 2223 may be a trapezoid. A height of each first convex bar 2221 may be defined as H1'. A height of each second convex bar 2223 may be defined as H3'. A width of each first convex bar 2221 may be defined as D1'. A width of each second convex bar 2223 may be defined as D2'. H1' may be in a range from 8 µm to 10 µm. H2' may be in a range from 5 µm to 7 µm. D1' may be in a range from 6 µm to 10 µm. D2' may be in a range from 6 µm to 10 µm.

In some embodiments, the cross section of the first convex bar 2221 in the direction perpendicular the extension direction of the first convex bar 2221 may be isosceles trapezoid, and the cross section of the second convex bar 2223 in the direction perpendicular the extension direction of the second convex bar 2223 may be isosceles trapezoid.

Figure 15:
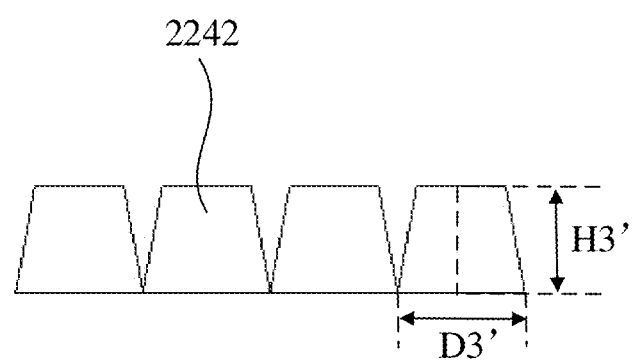
FIG. 15 is a cross sectional view of a texture layer in the second texture area according to some embodiments of the present disclosure.

It can be understood that, the shape of the cross section of each third convex bar 1242 in the direction perpendicular the extension direction of the third convex bar 1242 may not be limited to triangles. As shown in FIG. 15, in some embodiments, the shape of the cross section of each third convex bar 2242 in the direction perpendicular the extension direction of the third convex bar 2242 may be trapezoid. The height of each third convex bar 2242 may be defined as H3'. The width of each third convex bar 2242 may be defined as D3'. H3' may be in a range from 5 µm to 6 µm. D3' may be in a range from 6 µm to 10 µm. In some embodiments, the cross section of each third convex bar 2242 in the direction perpendicular the extension direction of the third convex bar 2242 may be an isosceles trapezoid.

Figure 16:
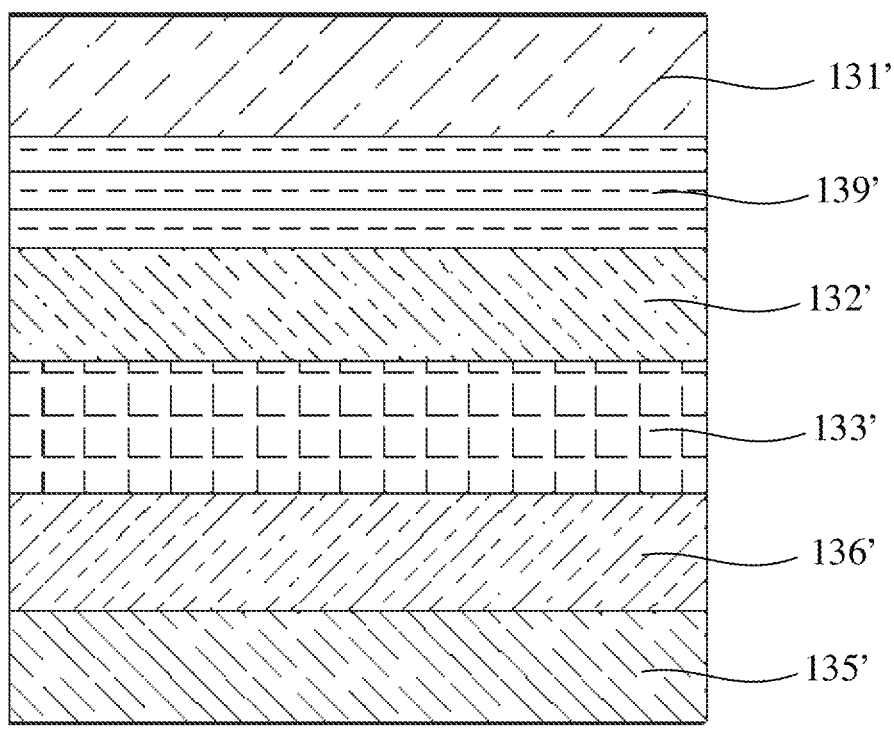
FIG. 16 is a cross sectional view of a reflection unit according to some embodiments of the present disclosure.

The structure of the reflection unit 130 may not be limited to the structure above, and may also be other structures. As shown in FIG. 16, in some embodiments, the reflection unit may also include a third refraction layer 139'. The third refraction layer 139' may be located between the attaching layer 131' and the first refraction layer 133'. A refractive index of the third refraction layer 139' may be greater than that of the first refraction layer 133'. Thus, the luminance effect of the reflection unit 130 may be further improved by the combination of the third refraction layer 139', the first refraction layer 133', and the second refraction layer 135'. Furthermore, the refractive index of the third layer 139' may be in a range from 2.55 to 2.76. Furthermore, the third refraction layer 139' may be a titanium dioxide layer, a trititanium pentoxide layer, or a niobium pentoxide layer.

In some embodiments, the reflection unit 130 may further include a first protection layer 132' and a second protection layer 136'. The first protection layer 132' may be located between the first refraction layer 133' and the third refraction layer 139'. The second protection layer 136' may be located between the first refraction layer 133' and the second refraction layer 135'. The first protection layer 132' may be an alumina layer or a silicon dioxide layer. The second protection layer 136' may be an alumina layer or a silicon dioxide layer. By setting the first protection layer 132' and the second protection layer 136', the first refraction layer 133' may be protected, the oxidation of the first refraction layer 133' may be reduced, and the mechanical strength of the reflecting unit 130 may also be increased.

In some embodiments, the attaching layer 131' may be a silicon dioxide layer, and the thickness of the attaching layer 131' may be in a range from 8 nm to 12 nm. The third refraction layer 139' may be a trititanium pentoxide layer, and the thickness of the third refraction layer 139' may be in a range from 7 nm to 17 nm. The first protection layer 132' may be a silicon dioxide layer, and the thickness of the first protection layer 132' may be in a range from 10 nm to 20 nm. The first refraction layer 133' may be indium layer, and the thickness of the first refraction layer 133' may be in a range from 10 nm to 20 nm. The second protection layer 136' may be a silicon dioxide layer, and the thickness of the second protection layer 136' may be in a range from 20 nm to 30 nm. The second refraction layer 135' may be a trititanium pentoxide layer, and the thickness of the second refraction layer 135' may be in a range from 5 nm to 9 nm. Thus, the oxidation of the first refraction layer 133' may be reduced and the mechanical strength of the reflecting unit 130 may be increased.

It can be understood that, the texture layer 120 may be coated on entire surface of the first film 110 close to the texture layer 120. Alternatively, the texture layer 120 may also be coated on a part of the surface of the first film 110 close to the texture layer 120. Thus, only a part of the surface of the shell 1a away from the substrate 10 may present the texture effect.

The number of the first texture area 122 may not be limited to one, and may also be more than one. Accordingly, the number of the first ribbon area 222 may not be limited to one, and may also be more than one. At this time, the plurality of first texture areas 122 may be spaced apart from each other. A second texture area 124 may be located between two adjacent first texture areas 122. The plurality of first ribbon areas 222 may correspond to the plurality of first texture areas 122 in one-to-one correspondence, such that one first ribbon area 222 may correspond to one first texture area 122. A second ribbon area 224 may be located between two adjacent first ribbon areas 222.

It can be understood that, the number of the first ribbon area 222 may not be limited to one, and may also be more than one. When the number of the first texture area 122 is one and the number of the first ribbon area 222 is more than one, the plurality of first ribbon areas 222 may be arranged at intervals or spaced apart from each other. A shading part may be located between the two adjacent first ribbon areas 222. The shading part may be configured to reduce the light transmission. The plurality of first ribbon areas 222 may correspond to the same one first texture area 122. Orthographic projections of the plurality of first ribbon areas 222 projected on a plane on which the first texture area 122 is located may fall in the first texture area 122. Furthermore, the shading part may be a black ribbon, a blue ribbon, or other deep ribbons. In some embodiments, the second ribbon area 224 may be formed between two adjacent first ribbon areas 222.

As further shown in FIGS. 1 to 11, a method for manufacturing the film structure 20 with color and luminant pattern effect according to some embodiments of the present disclosure may be further provided. The method for manufacturing the film structure 20 may include the operations.

S110, a first film assembly 100 may be provided. The first film assembly 100 may include a first film 110 and a texture layer 120 stacked on each other sequentially.

It should be noted that the structure of the first film assembly 100 may refer to those described above and will not be described in detail here.

In some embodiments, the method for manufacturing the film structure 20 may include the operations of manufacturing the first film assembly 100. The manufacturing the first film assembly 100 may include the operations including: forming the texture layer 120 on the first film 110 by the UV transfer-printing, such that the first film assembly 100 is acquired. Furthermore, the UV (Ultraviolet Rays) glue with light curing property may be utilized to transfer the texture of the designed mold to the first film 110, to form the texture layer 120 on the first film 110. It should be noted that the first film assembly 100 may not be limited to be manufactured by the method above, and may also be the first film assembly 100 commercially available.

In some embodiments, the energy of UV transfer-printing may be in a range from 500 mj/cm² to 1000 mj/cm².

In some embodiments, the operation of forming the texture layer 120 on the first film 110 may include: forming the first texture area 122 on the first film 110 and forming the second texture area 124 on the first film 110 to acquire the texture layer 120.

In some embodiments, the operation of forming the first texture area 122 on the first film 110 may include: forming a plurality of parallel first convex bars 1221 and a plurality of parallel second convex bars 1223 on the first film 110 to form the first texture area 122. Furthermore, the first texture area 122 may be formed on the first film 110 by UV transfer-printing. It should be noted that the structure of the first texture area 122 may be described above and will not be described here.

In some embodiments, the operation of forming the second texture area 124 on the first film 110 may include: forming a plurality of parallel third convex bars 1242 on the first film 110. Furthermore, the second texture area 124 may be formed on the first film 110 by UV transfer-printing. It should be noted that the structure of the third convex bar 1242 may be described above and will not be described here.

In some embodiments, the second texture area 124 may be arranged around the first texture area 122. The second texture area 124 and the first texture area 122 may be located gaplessly or without a gap. Furthermore, the operation of forming the texture layer 120 on the first film 110 may include: simultaneously forming both the first texture area 122 and the second texture area 124 on the first film 110.

Furthermore, the operation of forming the texture layer 120 on the first film 110 may include following operations.

S111, a mold with a first texture pattern and a second texture pattern may be provided. The first texture pattern may include a plurality of first protrusions and a plurality of second protrusions. The plurality of first protrusions and the plurality of second protrusions may be may be alternately arranged. The first texture pattern and the first texture area 122 may be intermeshed or engaged with each other. The second texture pattern may include a plurality of third protrusions, and the second texture pattern and the second texture area 124 may be intermeshed or engaged with each other. Furthermore, the second texture pattern may be arranged around the first texture pattern. The second texture pattern and the first texture pattern may be arranged gaplessly or without a gap.

In some embodiments, the operation S111 may include following operations.

S1111, a first female die with texture may be prepared. The texture of the first female die may be the same as that of the second texture area 124.

More specifically, the first female die with texture may be acquired by machining the first substrate with six cutters simultaneously by utilizing a CNC machine. Furthermore, the first substrate may be a flat steel plate.

S1112, a second female die with texture may be prepared, and the texture of the second female die may be the same as that of the first texture area 122.

More specifically, the second female die with texture may be acquired by machining the second substrate with six cutters simultaneously by utilizing a CNC machine. Furthermore, the second substrate may be a roller.

S1113, the texture of the first female die may be copied to the first female mold to acquire a mold having a plurality of third protrusions, a part of the plurality of third protrusions may be further removed to form the second texture pattern with a break or notch, thereby acquiring the mold having the second texture pattern.

The mold may be polycarbonate (PC) plate.

Furthermore, a part of the plurality of third protrusions may be removed by means of etching.

S1114, the texture of the second female die may be copied to the mold having the second texture pattern to form the first texture pattern. The first texture pattern may be located in the break or notch, thereby acquiring the mold having both the first texture pattern and the second texture pattern.

Furthermore, the texture of the second female die may be copied to the mold having the second texture pattern by means of roll to roll.

S112, UV glue may be coated on the mold having the first texture pattern and the second texture pattern, such that the UV glue may be located between the first protrusion and the second protrusion adjacent to the first protrusion and also between the two adjacent third protrusions. Then the UV glue may be transferred from the mold to the first film 110 and further cured on the first film 110, thereby acquiring the texture layer 120.

The UV glue corresponding to the first texture pattern forms the first texture area 122. The UV glue corresponding to the second texture pattern forms a second texture area 124.

Furthermore, the energy of UV transfer-printing may be in a range from 500 mj/cm² to 1000 mj/cm².

In some embodiments, after forming the texture layer 120 on the first film 110, the method may further include an operation of forming the reflection unit 130 on the texture layer 120. The forming the reflection unit 130 on the texture layer 120 may include: forming the attaching layer 131, the first refraction layer 133, and the second refraction layer 135 on the texture layer 120 sequentially. In some embodiments, the refractive index of the first refraction layer 133 may be less than that of the second refraction layer 135. By setting the attaching layer 131, the reflection unit 130 may be firmly attached to the texture layer 120. The combination of the first refraction layer 133 and the second refraction layer 135 makes the reflection unit 130 has a reflection effect to reflect light onto the first film 110, such that the luminance of the texture layer 120 may be increased. Furthermore, the attaching layer 131, the first refraction layer 133, and the second refraction layer 135 may be sequentially stacked on the texture layer 120 by the electronic evaporation process, in order to form the reflection unit 130.

In some embodiments, the refractive index of the first refraction layer 133 may be in a range from 0.68 to 0.72. The refractive index of the second refraction layer 135 may be in a range from 2.55 to 2.76. Furthermore, the first refraction layer 133 may be an indium layer. The second refraction layer 135 may be a titanium dioxide layer, a trititanium pentoxide layer, or a niobium pentoxide layer. Thus, the reflection unit 130 may have a better reflection effect.

In some embodiments, the attaching layer 131 may be an alumina layer or a silicon dioxide layer.

In some embodiments, the operation of forming the reflection unit 130 on the texture layer 120 may include: forming the attaching layer 131, the first refraction layer 133, the interlayer 137, and the second refraction layer 135 on the texture layer 120 sequentially; wherein the attaching layer 131, the first refraction layer 133, the interlayer 137, and the second refraction layer 135 are sequentially stacked on the texture layer 120. The interlayer 137 may be an alumina layer or a silicon dioxide layer. The combination of the interlayer 137 and the attaching layer 131 may protect the first refraction layer 133 and reduce the oxidation of the first refraction layer 133. Furthermore, the attaching layer 131, the first refraction layer 133, the interlayer 137, and the second refraction layer 135 may be sequentially stacked on the texture layer 120 by electronic evaporation.

More specifically, the attaching layer 131 may be an alumina layer, and the thickness of the attaching layer 131 may be in a range from 30 nm to 40 nm. The first refraction layer 133 may be an indium layer, and the thickness of the first refraction layer 133 may be in a range from 10 nm to 30 nm. The interlayer 137 may be an alumina layer, and the thickness of the interlayer 137 may be in a range from 30 nm to 40 nm. The second refraction layer 135 may be titanium dioxide layer, and the thickness of the second refraction layer 135 may be in a range from 3 nm to 7 nm. It should be noted that the thicker the first refraction layer 133 is, the better the reflection effect of the reflection unit 130 is, and the higher the luminance of the texture layer 120 is. However, the thicker the first refraction layer 133 is, the easier the first refraction layer 133 is to be oxidized. The thickness of the first refraction layer 133 above may not only ensure the luminance effect of the reflection unit 130, but also reduce the oxidation of the first refraction layer 133.

Furthermore, the thickness of the first refraction layer 133 may be in a range from 10 nm to 20 nm. The thickness of the first refraction layer 133 above may not only ensure the luminance effect of the reflection unit 130, but also protect the first refraction layer 133 and reduce the oxidation of the first refraction layer 133.

In some embodiments, after forming the reflection unit 130 on the texture layer 120, an operation of forming the ink layer 140 on the reflection unit 130 may be performed. Furthermore, the ink layer 140 may be formed on the reflection unit 130 by means of screen printing process. Furthermore, the thickness of the ink layer 140 may be in a range from 5 μm to 24 μm.

Furthermore, the ink layer 140 may be acquired by repeatedly printing ink materials on the texture layer 120 by means of the screen printing process. More specifically, the number of times of screen printing may be three. The thickness of the ink material in each printing may be a range from 5 μm to 8 μm. It should be noted that the number of times of screen printing may not be limited to three, and may be selected as required, such as two or four. The ink material may be low-temperature ink. The low-temperature ink may be the ink that is capable of getting dry at a lower temperature in a range from 80° C. to 90° C.

In some embodiments, after forming the texture layer 120, the reflection unit 130, and the ink layer 140 on the first film 110 sequentially, an operation of attaching a protective film (not shown) on one side of the ink layer 140 that faces away from the reflection unit 130 may be further performed. The ink layer 140 may be temporarily protected by the protective film.

S120, a ribbon unit 220 may be formed on the second film 210 by an ink-ribbon transfer-printing process to acquire the second film assembly 200.

It should be noted that the structure of the second film assembly 200 may be described above and will not be described here.

In some embodiments, in the process of forming the ribbon unit 220 on the second film 210 by the ink-ribbon transfer-printing process. A computer program may be utilized to control the transfer printing, such that the patterns with different color effects may be printed in different areas, and thus the ribbon unit 220 may be acquired. It should be noted that the ink-ribbon transfer-printing process requires a high level of environment and needs to be carried out in a hundred level of clean environment, such that the risk that the serious problems such as white spots and luminant spots caused by environmental dust may be reduced.

In some embodiments, the ribbon of the CMYK color system may be utilized in the process of forming the ribbon unit 220 on the second film 210 by the color-band transfer-printing process. Furthermore, in the process of forming the ribbon unit 220 on the second film 210 by the color-band transfer-printing process, the Japanese Fuji CMYK ribbon may be adopted. The resolution of the ribbon may be 600 DPI, and the ribbon may have a high fineness, and the appearance of the film structure 20 may be improved.

In some embodiments, the operation S120 may include following actions.

S121, a first monochrome layer 222a and a gradient color layer 222b may be formed on the second film 210 by the color-band transfer-printing process. The first monochrome layer 222a may be disposed on the second film 210, and the gradient color layer 222b may be disposed at one side of the first monochrome layer 222a that faces away from the second film 210. The position of the first ribbon area 222 may correspond to the position of the first texture area 122.

In some embodiments, the temperature for transfer printing may be in a range from 60° C. to 70° C. The time for transfer printing the first monochrome layer 222a may be in a range from 2 seconds to 3 seconds. The time for transfer printing the gradient color layer 222b may be in a range from 2 seconds to 3 seconds.

In some embodiments, the ribbon of the first monochrome layer 222a may be a cyan ribbon or magenta ribbon. The ribbon of the gradient color layer 222b may include at least one of the cyan ribbon, the yellow ribbon, and the magenta ribbon. It should be noted that the ribbon of the first monochrome layer 222a may not be limited to the ribbon above, and may also be the ribbon of other colors selected as required. The ribbon of the gradient color layer 222b may not be limited to the ribbons above, and may also be the ribbons of other colors selected as required.

S122, a plurality of second monochrome layers 224a successively stacked may be formed on the second film 210 by means of the color-band transfer-printing process to form the second ribbon area 224. The position of the second ribbon area 224 may correspond to the position of the second texture area 124.

In some embodiments, the temperature for transfer printing may be in a range from 60° C. to 70° C. The time for transfer printing the second monochrome layer 224a may be in a range from 2 seconds to 3 seconds.

In some embodiments, the ribbon of the second monochrome layer 224a may be a cyan ribbon or magenta ribbon.

It should be noted that the ribbon of the second monochrome layer 224a may not be limited to the ribbons above, and may also be the ribbons of other colors selected as required.

It should be noted that the sequence of the operation S121 and the operation S122 may not be limited. The operation S121 may be performed before the operation S122, the operation S122 may be performed before the operation S121, or the operation S121 and the operation S122 may be performed simultaneously.

In some embodiments, after forming the ribbon unit 220 on the second film 210 by the color-band transfer-printing process, an operation of attaching a protective film (not shown) at one side of the ribbon unit 220 away from the second film 210 may be further performed. The ribbon unit 220 may be temporarily protected by protective film.

S130, one side of the ribbon unit 220 that faces away from the second film 210 may be attached to one side of the first film 110 that faces away from the texture layer 120. In this way, the orthographic projection of the ribbon unit 220 projected on a plane on which the texture layer 120 is located may fall in the texture layer 120, and thus the film structure 20 may be acquired.

Furthermore, the operation S130 may further include an operation: attaching the surface of the ribbon unit 220 away from the second film 210 onto the adhesive layer 114, such that the orthographic projection of the ribbon unit 220 projected on a plane on which the texture layer 120 is located may fall in the texture layer 120. Thus, the film structure 20 may be acquired.

In some embodiments, the first film assembly 100 may include a first alignment part. The second film assembly 200 may include a second alignment part corresponding to the first alignment part. The operation S130 may include: aligning the first alignment part with the second alignment part, and attaching the ribbon unit 220 to the first film 110, such that the orthographic projection of the ribbon unit 220 projected on a plane on which the texture layer 120 is located may fall in the texture layer 120.

In some embodiments, the operation S130 may include: attaching the surface of the ribbon unit 220 away from the second film 210 onto the surface of the adhesive layer 114, such that the orthographic projection of the first ribbon area 222 projected on a plane on which the first texture area 122 is located may fall in the first texture area 122.

In some embodiments, the operation S130 may include: attaching the surface of the ribbon unit 220 away from the second film 210 onto the surface of the adhesive layer 114, such that the orthographic projection of the second ribbon area 224 projected on a plane on which the second texture area 124 is located may fall in the second texture area 124.

In some embodiments, the operation S130 may include: attaching the surface of the ribbon unit 220 away from the second film 210 onto the surface of the adhesive layer 114, such that not only the orthographic projection of the first ribbon area 222 projected on a plane on which the first texture area 122 is located falls on the first texture area 122, but also the orthographic projection of the second ribbon area 224 projected on a plane on which the second texture area 124 is located falls on the second texture area 124.

In the method for manufacturing the film structure 20 described above, the ribbon unit 220 may be formed on the second film 210 by the color-band transfer-printing process, and the texture layer 120 may be formed on the first film 110. Thus, the film structure 20 may present a pattern with color and luminance. The film structure 20 may be configured for manufacturing the shell 1a of the electronic device requiring good appearance. For example, the shell 1a may be a back cover of a mobile phone with 3D radian less than 4.0 mm.

Furthermore, in the method for manufacturing the film structure 20 described above, both the first ribbon area 222 and the second ribbon area 224 may be formed by the color-band transfer-printing process, such that the film structure 20 may present different color effects in different areas. Furthermore, in the method for manufacturing the film structure 20, by forming the first texture area 122 and the second texture area 124, the film structure 20 may present different luminance in different areas, and thus the shell 1a may present luminant pattern only on partial area.

Generally, the process of offset printing in the related art may include operations of: directly printing blue areas with different depths on the film by four-color offset printing (gravure printing); forming texture by UV transfer-printing; forming silicon titanium luminant film on the texture by electron-beam evaporation coating; forming an ink layer on the silicon titanium luminance film by screen printing. However, the pattern formed by the offset printing has high roughness and bad fineness. Furthermore, the single-layer offset printing has limitations to the design of UV texture, for example, the depth of UV texture cannot be too deep (cannot exceed 10 μm), and the UV texture after coating has poor color effect and insufficient luminance.

In the method for manufacturing the film structure 20 according to some embodiments of the present disclosure, the color fullness of the film structure 20 may be improved by attaching the first film assembly 100 to the second film assembly 200, the resolution of the ribbon unit 220 prepared by the color-band transfer-printing process may be higher, the color fineness of the ribbon unit 220 prepared by the color-band transfer-printing process may be better, the binding force between the texture layer 120 and the first film 110 may be greater, and the film structure 20 may be made to present different luminance effects by selecting the width and height of the texture, such as the convex bars of the texture layer 120.

It can be understood that, the adhesive layer 114 may also be omitted. In this structure, the ribbon unit 220 may be bonded to the first film 110 by coating an adhesive on the functional layer 112.

It can be understood that, the first texture area 122 may not be limited to the above structure, and may also be in other structures as shown in FIGS. 12-15. The structure of the first texture area 122 in other structures has been described above and will not be described here.

The operation of forming the reflection unit 130 may not be limited to the operation described above. As shown in FIG. 16, in some embodiments, the operation of forming the reflection unit 130 on the texture layer 120 may include: sequentially forming the attaching layer 131', the third refraction layer 139', the first refraction layer 133' and the second refraction layer 135' on the texture layer 120 (not shown) to acquire the reflection unit 130. In this case, the refractive index of the third refraction layer 139' may be greater than that of the first refraction layer 133'. Thus, the combination of the third refraction layer 139', the first refraction layer 133', and the second refraction layer 135' may further improve the luminance effect of the reflection unit 130. Furthermore, the refractive index of the third refraction layer 139' may be in a range from 2.55 to 2.76. Furthermore, the third refraction layer 139' may be a titanium dioxide layer, a trititanium pentoxide layer, or a niobium pentoxide layer.

Furthermore, in some embodiments, the operation of forming the reflection unit 130 on the texture layer 120 may include: sequentially forming the attaching layer 131', the third refraction layer 139', the first protection layer 132', the first refraction layer 133', the second protection layer 136', and the second refraction layer 135' on the texture layer 120. The first protection layer 132' may be an alumina layer or a silicon dioxide layer. The second protection layer 136' may be an alumina layer or a silicon dioxide layer. The first protection layer 132' and the second protection layer 136' may protect the first refraction layer 133', such that the oxidation of the first refraction layer 133' may be reduced, and the mechanical strength of the reflecting unit 130 may also be increased.

In some embodiments, the attaching layer 131' may be a silicon dioxide layer, and the thickness of the attaching layer 131' may be in a range from 8 nm to 12 nm. The third refraction layer 139' may be a trititanium pentoxide layer, and the thickness of the third refraction layer 139' may be in a range from 7 nm to 17 nm. The first protection layer 132' may be a silicon dioxide layer, and the thickness of the first protection layer 132' may be in a range from 10 nm to 20 nm. The first refraction layer 133' may be indium layer, and the thickness of the first refraction layer 133' may be in a range from 10 nm to 20 nm. The second protection layer 136' may be a silicon dioxide layer, and the thickness of the second protection layer 136' may be in a range from 20 nm to 30 nm. The second refraction layer 135' may be a trititanium pentoxide layer, and the thickness of the second refraction layer 135' may be in a range from 5 nm to 9 nm. Thus, the oxidation of the first refraction layer 133' may be reduced and the mechanical strength of the reflecting unit 130 may be increased.

In some embodiments, the operation S111 may be omitted. In this way, the texture layer 120 may include only a plurality of parallel third convex bars 1242.

In some embodiments, the operation S112 may be omitted. In this way, the texture layer 120 may include only a plurality of parallel first convex bars 1221 and a plurality of parallel second convex bars 1223.

In some embodiments, the operation S121 may be omitted. In this way, the ribbon unit 220 may include only a plurality of second monochrome layers 224a stacked on one another.

In some embodiments, the operation S122 may be omitted. In this way, the ribbon unit 220 may include only the first monochrome layer 222a and the gradient color layer 222b stacked on one another.

It can be understood that, the number of the first ribbon areas 222 may not be limited to one, and may be more than one. When the number of the first texture areas 122 is one and the number of the first ribbon areas 222 is more than one, the plurality of first ribbon areas 222 may be spaced apart from each other. A shading part may be formed between two adjacent first ribbon areas 222. The shading part may reduce the light transmission. All the plurality of first ribbon areas 222 correspond to the same one first texture area 122. The orthographic projections of the plurality of first ribbon areas 222 projected on a plane on which the first texture area 122 is located may fall in the first texture area 122. Thus, the accuracy requirement for aligning the first ribbon area 222 and the first texture area 122 may be reduced, such that it is more convenient for operation. Furthermore, the shading part may be a deep ribbon such as a black ribbon or a blue ribbon. In some embodiments, a second ribbon area 224 may be formed between two adjacent first ribbon areas 222.

The number of the breaks or notches of the second texture pattern may not be limited to one, and may also be more than one. Accordingly, the number of the first texture patterns may not be limited to one, and may also be more than one. The number of the first texture areas 122 may not be limited to one, and may also be more than one. Accordingly, the number of the first ribbon area 222 may be also more than one. The plurality of first ribbon areas 222 may correspond to the plurality of first texture areas 122 in one-to-one correspondence, such that one first ribbon area 222 may correspond to one first texture area 122. A second ribbon area 224 may be located between two adjacent first ribbon areas 222. In the process of forming the texture layer 120 on the first film 110, the first texture area 122 and the second texture area 124 may be formed on the first film 110 simultaneously. Alternatively, the second texture area 124 may be formed on the first film 110 first, and after that the first texture area 122 may be formed on the first film 110. Alternatively, the first texture area 122 may be formed on the first film 110 first, and after that the second texture area 124 may be formed on the first film 110.

Furthermore, the operation of forming the first texture area 122 may include:
machining the first substrate with six cutters simultaneously by utilizing a CNC machine, to acquire a first female die with a first texture, the first texture of the first female die may be the same as that of the first texture area 122; copying the first texture of the first female die to the first polycarbonate (PC) plate; then coating the first PC plate with a first UV glue, and transferring the first UV glue from the first PC plate to the first film 110; and solidifying or curing the first UV glue on the first film 110 to form the first texture area 122. The first substrate may be a roller. The way to copy the texture of the first female die to the first PC plate may be roll to roll. Furthermore, the energy of UV transfer-printing may be in a range from 500 mj/cm2 to 1000 mj/cm2.

The operation of forming the second texture area 124 may include: machining the second substrate with six cutters simultaneously by a CNC machine to acquire a second female die with a second texture, the second texture of the second female die may be the same as that of the second texture area 124; copying the second texture of the second female die to a second PC plate; coating the second PC plate with a second UV glue, transferring the second UV glue from the second PC plate to the first film 110; and solidifying or curing the second UV glue on the first film 110 to form the second texture area 124. The second substrate may be plane steel plate. Furthermore, the energy of UV transfer-printing may be in a range from 500 mj/cm2 to 1000 mj/cm2.

It can be understood that, the first texture area 122 and the second texture area 124 may be located gaplessly or without a gap. Alternatively, the first texture area 122 and the second texture area 124 may be spaced apart from each other with a gap defined therebetween.

In addition, a method for manufacturing the shell 1a may be also provided according to some embodiments of the present disclosure. The method may make the shell 1a with good appearance. The method for manufacturing the shell 1a may include the following operations: bonding the film structure 20 acquired above on the substrate 10, such that the second film 210 may face towards the substrate 10 (that is, located between the ribbon unit 220 and the substrate 10), and thus the shell 1a may be acquired.

Furthermore, the protective film on the bonding layer 214 may be peeled off or removed, and the substrate 10 may be attached to the bonding layer 214 to acquire the shell 1a.

In some embodiments, after the operation of attaching the substrate 10 to the film structure 20, an operation of defoaming or removing bubble between the substrate 10 and the film structure 20 may be further performed. Furthermore, the removing bubble may be performed in vacuum chamber. Furthermore, the removing bubble may be performed at 45° C.~55° C. under the pressure of 7 kg~12 kg for 30 minutes to 50 minutes. In some embodiments, the removing bubble may be performed for 40 minutes.

In some embodiments, after the operation of removing bubble between the substrate 10 and the film structure 20, an operation of cutting the substrate 10 with the film structure 20 thereon may be further performed. The shell 1a in desired size may be acquired by cutting. Furthermore, the cutting may be performed by a laser. Furthermore, the substrate 10 with the film structure 20 thereon may be cut into six to eight shells 1a. It should be noted that, the substrate 10 with the film structure 20 may also be cut into a single shell 1a or ten shells 1a, which may be selected as required.

The example embodiments may be provided as following.

If there is no specific statement, in the following example embodiments, the ink material of the ink layer may be the PET low-temperature ink commercially available, and the drying temperature may be in a range from 80° C. to 90° C. The ribbon used in the color-band transferring-printing process may be the CMYK ribbon from Japanese Fuji. The texture layer may be formed at one side of the functional layer that faces away from the adhesive layer by the UV transfer-printing according to the operation S121 to operation S122 above.

Example Embodiment 1

The structure of the shell of the example embodiment 1 may be as shown in FIGS. 1-11. The shell of the example embodiment 1 may be manufactured by the following operations.

(1) The first film may be an HP12 explosion-proof membrane (purchased from SKC Company). The first film may include a functional layer and an adhesive layer stacked on the functional layer. The functional layer may be made of PET. The thickness of the functional layer may be 50 µm. The adhesive layer may be made of OCA. The thickness of the adhesive layer may be 25 µm. The texture layer may be formed on the surface of the functional layer away from the adhesive layer by the UV transfer-printing process. A1 may be 90 degrees. D1 may be 8 µm. H1 may be 9 µm. D2 may be 8 µm. H2 may be 6 µm. A3 may be 30 degrees. D3 may be 8 µm. H3 may be 5.5 µm. The energy for the UV transfer-printing process may be 800 mj/cm2.

(2) The attaching layer, the first refraction layer, the interlayer, and the second refraction layer may be sequentially disposed on the texture layer by the electronic evaporation process to acquire the reflection unit. The attaching layer may be an alumina layer. The thickness of the attaching layer may be 35 nm. The first refraction layer may be an indium layer. The thickness of the first refraction layer may be 15 nm. The interlayer may be an alumina layer. The thickness of the interlayer may be 35 nm. The second refraction layer may be a titanium dioxide layer. The thickness of the second refraction layer may be 5 nm.

(3) The ink material may be printed on the second refraction layer by the screen-printing process to form an ink layer, thereby acquiring the first film assembly. The screen-printing processes may be performed for three times. The thickness of ink material in each screen-printing process may be 5 µm.

(4) The second film may be TP23E0 explosion-proof membrane (purchased from SKC Company). The second film may include an explosion-proof layer and a bonding layer stacked on one another. The material of explosion-proof layer may be PET. The thickness of the explosion-proof layer may be 23 µm. The material of bonding layer may be OCA. The thickness of the bonding layer may be 15 µm. Two first monochrome layers stacked on one another may be formed on the second film by the color-band transfer-printing process, and five gradient color layer stacked on one another may be formed on the surface of one of the first monochrome layers that is farthest from the second film by the color-band transfer-printing process, in order to form the first ribbon area. The temperature for the transfer-printing process may be 65° C. The time for transfer printing each first monochrome layer may be 2 seconds. Two second monochrome layers stacked on one another may be further formed on the second film by the color-band transfer-printing process, in order to form the second ribbon area, thereby acquiring the ribbon unit. The temperature for the transfer-printing process may be 65° C. The time for transfer printing each second monochrome layer may be 2 seconds. The time for transfer printing each gradient color layer may be 2 seconds.

(5) The protective film of the first film may be peeled off or removed, and the ribbon unit may be attached to the adhesive layer of the first film assembly, such that the orthographic projection of the first ribbon area projected on a plane on which the first texture area is located may fall in the first texture area, and the orthographic projection of the second ribbon area projected on a plane on which the second texture area is located may fall in the second texture area, thereby acquiring the film structure.

(6) The protective film on the second film may be peeled off or removed, the substrate may be attached to the bonding layer of the second film assembly, bubble may be removed in a vacuum chamber, and a laser cutting may be further performed, thereby acquiring the shell. The substrate may be a transparent glass plate. The thickness of the substrate may be 0.6 nm. The bubble-removing process may be performed at a temperature of 50° C. and a pressure of 9 kg for 40 minutes.

Figure 17:
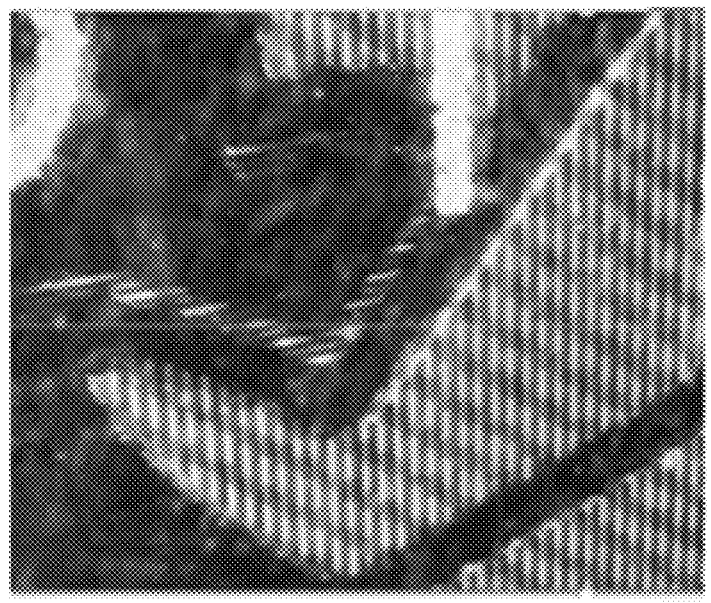
FIG. 17 is an image of a pattern of the shell corresponding to the first ribbon area of example embodiment 1.
Figure 18:
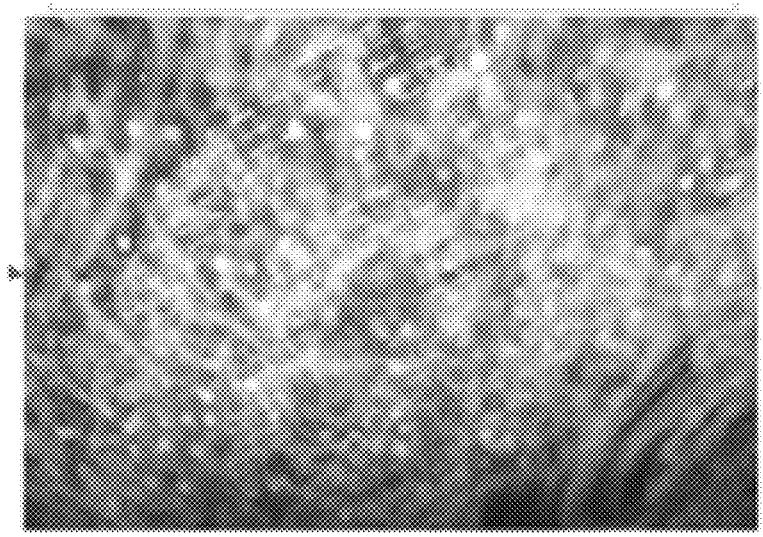
FIG. 18 is an image of a pattern of the shell corresponding to the second ribbon area of example embodiment 1.

After preparation, the images of the shell of example embodiment 1 may be shown in FIGS. 17-18. FIG. 17 is an image of a pattern of the shell corresponding to the first ribbon area. FIG. 18 is an image of a pattern of the shell corresponding to the second ribbon area. It may be seen from FIGS. 17 to 18 that the luminance of the pattern corresponding to the first ribbon of the shell may be higher or greater than that of the pattern corresponding to the second ribbon of the shell, and the resolution of the pattern corresponding to the first ribbon of the shell may be higher than that of the pattern corresponding to the second ribbon of the shell.

Example Embodiment 2

The shell of the example embodiment 2 may be similar to the shell of the example embodiment 1, except that the parameters of the layers of the shell of example embodiment 2 may be different from those of the example embodiment 1. The shell of the example embodiment 2 may be made by the following operations.

(1) The first film may be a PET explosion-proof membrane (purchased from SKC Company). The first film comprises a functional layer and an adhesive layer stacked on one another. The material of functional layer may be PET. The thickness of the functional layer may be 48 µm. The material of the adhesive layer may be OCA. The thickness of the adhesive layer may be 20 μm. The texture layer may be formed on the surface of the functional layer away from the adhesive layer by the UV transfer-printing process. A1 may be 85 degrees. D1 may be 6 μm. H1 may be 8 μm. D2 may be 6 μm. H2 may be 5 μm. A3 may be 25 degrees. D3 may be 6 μm. H3 may be 5 μm. The energy for the UV transfer-printing process may be 500 mj/cm2.

(2) The attaching layer, the first refraction layer, the interlayer, and the second refraction layer may be sequentially disposed on the texture layer by the electronic evaporation process to acquire the reflection unit. The attaching layer may be an alumina layer. The thickness of the attaching layer may be 30 nm. The first refraction layer may be an indium layer. The thickness of the first refraction layer may be 10 nm. The interlayer may be an alumina layer. The thickness of the interlayer may be 30 nm. The second refraction layer may be a titanium dioxide layer. The thickness of the second refraction layer may be 3 nm.

(3) The ink material may be printed on the second refraction layer by the screen-printing process to form an ink layer, thereby acquiring the first film assembly. The screen-printing processes may be performed for three times. The thickness of ink material in each screen-printing process may be 8 μm.

(4) The second film may be a PET explosion-proof membrane (purchased from SKC Company). The second film may include an explosion-proof layer and a bonding layer stacked on one another. The material of explosion-proof layer may be PET. The thickness of the explosion-proof layer may be 21 μm. The material of bonding layer may be OCA. The thickness of the bonding layer may be 15 μm. Two first monochrome layers stacked on one another may be formed on the second film by the color-band transfer-printing process, and five gradient color layers stacked on one another may be formed on the surface of the first monochrome layer farthest away from the second film by the color-band transfer-printing process, thereby forming the first ribbon area. The temperature for the transfer-printing process may be 60° C. The time for transfer printing each first monochrome layer may be 3 seconds. Two second monochrome layers stacked on one another may be further formed on the second film by the color-band transfer-printing process to form the second ribbon area, thereby acquiring the ribbon unit. The temperature for the transfer-printing process may be 60° C. The time for transfer printing each second monochrome layer may be 3 seconds. The time for transfer printing each gradient color layer may be 3 seconds.

(5) The protective film of the first film may be peeled off or removed, and the ribbon unit may be attached to the adhesive layer of the first film assembly, such that the orthographic projection of the first ribbon area projected on a plane on which the first texture area is located falls in the first texture area, and the orthographic projection of the second ribbon area projected on a plane on which the second texture area is located falls in the second texture area, thereby acquiring the film structure.

(6) The protective film on the second film may be peeled off or removed, the substrate may be attached to the bonding layer of the second film assembly, bubble may be removed in a vacuum chamber, and a laser cutting may be further performed, thereby acquiring the shell. The substrate may be a transparent glass plate. The thickness of the substrate may be 0.5 nm. The bubble-removing process may be performed at a temperature of 45° C. and a pressure of 7 kg for 30 minutes.

Example Embodiment 3

The shell of the example embodiment 3 may be similar to the shell of the example embodiment 1, except that the parameters of the layers of the shell of the example embodiment 3 may be different from those of the example embodiment 1. The shell of the example embodiment 3 may be made by the following operations.

(1) The first film may be a PET explosion-proof membrane (purchased from SKC Company). The first film comprises a functional layer and an adhesive layer stacked on one another. The material of functional layer may be PET. The thickness of the functional layer may be 52 μm. The material of the adhesive layer may be OCA. The thickness of the adhesive layer may be 30 μm. The texture layer may be formed on the surface of the functional layer away from the adhesive layer by the UV transfer-printing process. A1 may be 95 degrees. D1 may be 10 μm. H1 may be 10 μm. D2 may be 10 μm. H2 may be 7 μm. A3 may be 35 degrees. D3 may be 10 μm. H3 may be 6 μm. The energy for the UV transfer-printing process may be 1000 mj/cm2.

(2) The attaching layer, the first refraction layer, the interlayer, and the second refraction layer may be sequentially disposed on the texture layer by the electronic evaporation process to acquire the reflection unit. The attaching layer may be an alumina layer. The thickness of the attaching layer may be 40 nm. The first refraction layer may be an indium layer. The thickness of the first refraction layer may be 30 nm. The interlayer may be an alumina layer. The thickness of the interlayer may be 40 nm. The second refraction layer may be a titanium dioxide layer. The thickness of the second refraction layer may be 7 nm.

(3) The ink material may be printed on the second refraction layer by the screen-printing process to form an ink layer, thereby acquiring the first film assembly. The screen-printing processes may be performed for once (that is, one time). The thickness of ink material in each screen-printing process may be 5 μm.

(4) The second film may be a PET explosion-proof membrane (purchased from SKC Company). The second film may include an explosion-proof layer and a bonding layer stacked on one another. The material of explosion-proof layer may be PET. The thickness of the explosion-proof layer may be 25 μm. The material of bonding layer may be OCA. The thickness of the bonding layer may be 25 μm. Two first monochrome layers stacked on one another may be formed on the second film by the color-band transfer-printing process, and five gradient color layers stacked on one another may be formed on the surface of the first monochrome layer farthest away from the second film by the color-band transfer-printing process, thereby forming the first ribbon area. The temperature for the transfer-printing process may be 70° C. The time for transfer printing each first monochrome layer may be 2 seconds. Two second monochrome layers stacked on one another may be further formed on the second film by the color-band transfer-printing process to form the second ribbon area, thereby acquiring the ribbon unit. The temperature for the transfer-printing process may be 70° C. The time for transfer printing each second monochrome layer may be 2 seconds. The time for transfer printing each gradient color layer may be 2 seconds.

(5) The protective film of the first film may be peeled off or removed, and the ribbon unit may be attached to the adhesive layer of the first film assembly, such that the orthographic projection of the first ribbon area projected on a plane on which the first texture area is located falls in the first texture area, and the orthographic projection of the second ribbon area projected on a plane on which the second texture area is located falls in the second texture area, thereby acquiring the film structure.

(6) The protective film on the second film may be peeled off or removed, the substrate may be attached to the bonding layer of the second film assembly, bubble may be removed in a vacuum chamber, and a laser cutting may be further performed, thereby acquiring the shell. The substrate may be a transparent glass plate. The thickness of the substrate may be 0.7 nm. The bubble-removing process may be performed at a temperature of 55° C. and a pressure of 12 kg, for 50 minutes.

Example Embodiment 4

The structure of the shell of the example embodiment 4 may be as shown in FIGS. 1~6, 8~11 and 16. The shell of the example embodiment 4 may be made by the following operations.

(1) The first film may be an HP12 explosion-proof membrane (purchased from SKC Company). The first film may include a functional layer and an adhesive layer stacked on the functional layer. The functional layer may be made of PET. The thickness of the functional layer may be 50 μm. The adhesive layer may be made of OCA. The thickness of the adhesive layer may be 25 μm. The texture layer may be formed on the surface of the functional layer away from the adhesive layer by the UV transfer-printing process. The texture layer may be formed on the surface of the functional layer away from the adhesive layer by UV transfer-printing. A1 may be 90 degrees. D1 may be 8 μm. H1 may be 9 μm. D2 may be 8 μm. H2 may be 6 μm. A3 may be 30 degrees. D3 may be 8 μm. H3 may be 5.5 μm. The energy for the UV transfer-printing process may be 800 mj/cm2.

(2) The attaching layer, the third refraction layer, the first protection layer, the first refraction layer, the second protection layer, and the second refraction layer may be sequentially disposed on the texture layer by the electronic evaporation process to acquire the reflection unit. The attaching layer may be a silicon dioxide layer. The thickness of the attaching layer may be 10 nm. The third refraction layer may be a trititanium pentoxide layer. The thickness of the first refraction layer may be 12 nm. The first protection layer may be silicon dioxide layer. The thickness of the first protection layer may be 15 nm. The first refraction layer may be an indium layer. The thickness of the first refraction layer may be 15 nm. The second protection layer may be a silicon dioxide layer. The thickness of the second protection layer may be 25 nm. The second refraction layer may be a trititanium pentoxide layer. The thickness of the second refraction layer may be 7 nm.

(3) The ink material may be printed on the second refraction layer by the screen-printing process to form an ink layer, thereby acquiring the first film assembly. The screen-printing processes may be performed for three times. The thickness of ink material in each screen-printing process may be 5 μm.

(4) The second film may be TP23E0 explosion-proof membrane (purchased from SKC Company). The second film may include an explosion-proof layer and a bonding layer stacked on one another. The material of explosion-proof layer may be PET. The thickness of the explosion-proof layer may be 23 μm. The material of bonding layer may be OCA. The thickness of the bonding layer may be 15 μm. Two first monochrome layers stacked on one another may be formed on the second film by the color-band transfer-printing process, and five gradient color layer stacked on one another may be formed on the surface of one of the first monochrome layers that is farthest from the second film by the color-band transfer-printing process, in order to form the first ribbon area. The temperature for the transfer-printing process may be 65° C. The time for transfer printing each first monochrome layer may be 2 seconds. Two second monochrome layers stacked on one another may be further formed on the second film by the color-band transfer-printing process, in order to form the second ribbon area, thereby acquiring the ribbon unit. The temperature for the transfer-printing process may be 65° C. The time for transfer printing each second monochrome layer may be 2 seconds. The time for transfer printing each gradient color layer may be 2 seconds.

(5) The protective film of the first film may be peeled off or removed, and the ribbon unit may be attached to the adhesive layer of the first film assembly, such that the orthographic projection of the first ribbon area projected on a plane on which the first texture area is located may fall in the first texture area, and the orthographic projection of the second ribbon area projected on a plane on which the second texture area is located may fall in the second texture area, thereby acquiring the film structure.

(6) The protective film on the second film may be peeled off or removed, the substrate may be attached to the bonding layer of the second film assembly, bubble may be removed in a vacuum chamber, and a laser cutting may be further performed, thereby acquiring the shell. The substrate may be a transparent glass plate. The thickness of the substrate may be 0.6 nm. The bubble-removing process may be performed at a temperature of 50° C. and a pressure of 9 kg for 40 minutes.

Example Embodiment 5

The shell of the example embodiment 5 may be similar to the shell of the example embodiment 4, except that the parameters of the layers of the shell of example embodiment 5 may be different from those of example embodiment 4. The shell of the example embodiment 5 may be made by the following operations.

(1) The first film may be a PET explosion-proof membrane (purchased from SKC Company). The first film comprises a functional layer and an adhesive layer stacked on one another. The material of functional layer may be PET. The thickness of the functional layer may be 48 μm. The material of the adhesive layer may be OCA. The thickness of the adhesive layer may be 20 μm. The texture layer may be formed on the surface of the functional layer away from the adhesive layer by the UV transfer-printing process. A1 may be 85 degrees. D1 may be 6 μm. H1 may be 8 μm. D2 may be 6 μm. H2 may be 6 μm. A3 may be 25 degrees. D3 may be 6 μm. H3 may be 5 μm. The energy for UV transfer-printing may be 500 mj/cm2.

(2) The attaching layer, the third refraction layer, the first protection layer, the first refraction layer, the second protection layer, and the second refraction layer may be sequentially disposed on the texture layer by the electronic evaporation process to acquire the reflection unit. The attaching layer may be a silicon dioxide layer. The thickness of the attaching layer may be 8 nm. The third refraction layer may be a trititanium pentoxide layer. The thickness of the first refraction layer may be 7 nm. The first protection layer may be a silicon dioxide layer. The thickness of the first protection layer may be 10 nm. The first refraction layer may be an indium layer. The thickness of the first refraction layer may be 10 nm. The second protection layer may be a silicon dioxide layer. The thickness of the second protection layer may be 20 nm. The second refraction layer may be a trititanium pentoxide layer. The thickness of the second refraction layer may be 5 nm.

(3) The ink material may be printed on the second refraction layer by the screen-printing process to form an ink layer, thereby acquiring the first film assembly. The screen-printing processes may be performed for three times. The thickness of ink material in each screen-printing process may be 5 μm.

(4) The second film may be a PET explosion-proof membrane (purchased from SKC Company). The second film may include an explosion-proof layer and a bonding layer stacked on one another. The material of explosion-proof layer may be PET. The thickness of the explosion-proof layer may be 21 μm. The material of bonding layer may be OCA. The thickness of the bonding layer may be 15 μm. Two first monochrome layers stacked on one another may be formed on the second film by the color-band transfer-printing process, and five gradient color layers stacked on one another may be formed on the surface of the first monochrome layer farthest away from the second film by the color-band transfer-printing process, thereby forming the first ribbon area. The temperature for the transfer-printing process may be 60° C. The time for transfer printing each first monochrome layer may be 3 seconds. Two second monochrome layers stacked on one another may be further formed on the second film by the color-band transfer-printing process to form the second ribbon area, thereby acquiring the ribbon unit. The temperature for the transfer-printing process may be 60° C. The time for transfer printing each second monochrome layer may be 3 seconds. The time for transfer printing each gradient color layer may be 3 seconds.

(5) The protective film of the first film may be peeled off or removed, and the ribbon unit may be attached to the adhesive layer of the first film assembly, such that the orthographic projection of the first ribbon area projected on a plane on which the first texture area is located falls in the first texture area, and the orthographic projection of the second ribbon area projected on a plane on which the second texture area is located falls in the second texture area, thereby acquiring the film structure.

(6) The protective film on the second film may be peeled off or removed, the substrate may be attached to the bonding layer of the second film assembly, bubble may be removed in a vacuum chamber, and a laser cutting may be further performed, thereby acquiring the shell. The substrate may be a transparent glass plate. The thickness of the substrate may be 0.5 nm. The bubble-removing process may be performed at a temperature of 45° C. and a pressure of 7 kg for 30 minutes.

Example Embodiment 6

The shell of the example embodiment 6 may be similar to the shell of the example embodiment 4, except that the parameters of the layers of the shell of the example embodiment 6 may be different from those of example embodiment 4. The shell of the example embodiment 6 may be made by the following operations.

(1) The first film may be a PET explosion-proof membrane (purchased from SKC Company). The first film comprises a functional layer and an adhesive layer stacked on one another. The material of functional layer may be PET. The thickness of the functional layer may be 52 μm. The material of the adhesive layer may be OCA. The thickness of the adhesive layer may be 30 μm. The texture layer may be formed on the surface of the functional layer away from the adhesive layer by the UV transfer-printing process. A1 may be 95 degrees. D1 may be 10 μm. H1 may be 10 μm. D2 may be 10 μm. H2 may be 6 μm. A3 may be 35 degrees. D3 may be 10 μm. H3 may be 6 μm. The energy for the UV transfer-printing process may be 1000 mj/cm2.

(2) The attaching layer, the third refraction layer, the first protection layer, the first refraction layer, the second protection layer, and the second refraction layer may be sequentially disposed on the texture layer by the electronic evaporation process to acquire the reflection unit. The attaching layer may be a silicon dioxide layer. The thickness of the attaching layer may be 12 nm. The third refraction layer may be a trititanium pentoxide layer. The thickness of the first refraction layer may be 17 nm. The first protection layer may be a silicon dioxide layer. The thickness of the first protection layer may be 20 nm. The first refraction layer may be an indium layer. The thickness of the first refraction layer may be 20 nm. The second protection layer may be a silicon dioxide layer. The thickness of the second protection layer may be 30 nm. The second refraction layer may be a trititanium pentoxide layer. The thickness of the second refraction layer may be 9 nm.

(3) The ink material may be printed on the second refraction layer by the screen-printing process to form an ink layer, thereby acquiring the first film assembly. The screen-printing processes may be performed for three times. The thickness of ink material in each screen-printing process may be 7 μm.

(4) The second film may be a PET explosion-proof membrane (purchased from SKC Company). The second film may include an explosion-proof layer and a bonding layer stacked on one another. The material of explosion-proof layer may be PET. The thickness of the explosion-proof layer may be 25 μm. The material of bonding layer may be OCA. The thickness of the bonding layer may be 17 μm. Two first monochrome layers stacked on one another may be formed on the second film by the color-band transfer-printing process, and five gradient color layers stacked on one another may be formed on the surface of the first monochrome layer farthest away from the second film by the color-band transfer-printing process, thereby forming the first ribbon area. The temperature for the transfer-printing process may be 70° C. The time for transfer printing each first monochrome layer may be 2 seconds. Two second monochrome layers stacked on one another may be further formed on the second film by the color-band transfer-printing process to form the second ribbon area, thereby acquiring the ribbon unit. The temperature for the transfer-printing process may be 70° C. The time for transfer printing each second monochrome layer may be 2 seconds. The time for transfer printing each gradient color layer may be 2 seconds.

(5) The protective film of the first film may be peeled off or removed, and the ribbon unit may be attached to the adhesive layer of the first film assembly, such that the orthographic projection of the first ribbon area projected on a plane on which the first texture area is located falls in the first texture area, and the orthographic projection of the second ribbon area projected on a plane on which the second texture area is located falls in the second texture area, thereby acquiring the film structure.

(6) The protective film on the second film may be peeled off or removed, the substrate may be attached to the bonding layer of the second film assembly, bubble may be removed in a vacuum chamber, and a laser cutting may be further performed, thereby acquiring the shell. The substrate may be a transparent glass plate. The thickness of the substrate may be 0.7 nm. The bubble-removing process may be performed at a temperature of 55° C. and a pressure of 12 kg, for 50 minutes.

Example Embodiment 7

The method for manufacturing the shell of the example embodiment 7 may be similar to that of the example embodiment 5, except that H1 is 8 μm, and H2 is 7 μm.

Example Embodiment 8

The method for manufacturing the shell of the example embodiment 8 may be similar to that of the example embodiment 6, except that H1 is 10 μm, and H2 is 5 μm.

Example Embodiment 9

The method for manufacturing the shell of the example embodiment 9 may be similar to that of the example embodiment 2, except that D1 is 4 μm, and D2 is 4 μm.

Example Embodiment 10

The method for manufacturing the shell of the example embodiment 10 may be similar to that of the example embodiment 3, except that D1 is 12 μm, and D2 is 12 μm.

Example Embodiment 11

The method for manufacturing the shell of the example embodiment 11 may be similar to that of the example embodiment 2, except that the thickness of the first refraction layer is 5 nm.

Example Embodiment 12

The method for manufacturing the shell of the example embodiment 12 may be similar to that of the example embodiment 3, except that the thickness of the first refraction layer is 35 nm.

Example Embodiment 13

The method for manufacturing the shell of the example embodiment 13 may be similar to that of the example embodiment 1, except that the structure of the first convex bar, the second convex bar, and the third convex bar may be as shown in FIGS. 14-15. The cross section of the first convex bar in the direction perpendicular the extension direction of the first convex bar may be in shape of an isosceles trapezoid, the cross section of the second convex bar in the direction perpendicular the extension direction of the second convex bar may be in shape of an isosceles trapezoid, and the cross section of the third convex bar in the direction perpendicular the extension direction of the third convex bar may be in shape of an isosceles trapezoid. D1' is 8 μm. H1' is 9 μm. D2' is 8 μm. H2' is 6 μm. D3' is 8 μm. H3' is 5.5 μm.

Example Embodiment 14

The method for manufacturing the shell of the example embodiment 14 may be similar to that of the example embodiment 1, except that the cross section of each first convex bar in the direction perpendicular the extension direction of the first convex bar may be in shape of a semicircle with a diameter of 8 μm, and a convex surface of each first convex bar may face away from the first film. The cross section of each second convex bar in the direction perpendicular the extension direction of the second convex bar may be in shape of a semicircle with a diameter of 8 μm, and a convex surface of each second convex bar may face away from the first film.

Example Embodiment 15

The method for manufacturing the shell of the example embodiment 15 may be similar to that of the example embodiment 1, except that the cross section of each third convex bar in the direction perpendicular the extension direction of the third convex bar may be in shape of a semicircle with a diameter of 8 μm, and a convex surface of each third convex bar may face away from the first film.

Example Embodiment 16

The method for manufacturing the shell of the example embodiment 16 may be similar to that of the example embodiment 1, except that a first offset layer and a second offset layer spaced apart from each other may be formed on the second film by the offset-printing printing to acquire the color unit. After peeling off the protective film of the first film, and the color unit may be attached to the adhesive layer of the first film assembly, such that an orthographic projection of the first offset layer projected on the first film assembly falls into the first texture area, and an orthographic projection of the second offset layer projected on the first film assembly falls into the second texture area.

Testing:

The luminance and the resolution of the pattern corresponding to the first ribbon area and the pattern corresponding to the second ribbon area of each shell of embodiments 1~16 may be measured. Drawing force between the texture layer and the first film of the shell of the embodiments 1~16 may be measured. The luminance (represented by L in table 1) of the pattern in a direction perpendicular to the extension direction of the first film may be measured by a colorimeter. The resolution of the pattern may be measured by a test card for the resolution. The drawing force may be measured by a detector for the drawing force. The testing results may be shown in table 1. The resolution of the pattern refers to the number of pixels per inch in the image. "Pattern corresponding to the first ribbon area" refers to the resolution and luminance of the pattern corresponding to the first ribbon area of each shell. "Pattern corresponding to the second ribbon area" refers to the resolution and luminance of the pattern corresponding to the second ribbon area of each shell.

Table 1 shows the luminance and the resolution of the pattern corresponding to the first ribbon area, the luminance and resolution of the pattern corresponding to the second ribbon area, and the bonding force between the texture layer and the first film, of the shells of embodiments 1~16.

TABLE 1

| Drawing | Pattern corresponding to the first ribbon area | | Pattern corresponding to the second ribbon area | |
| --- | --- | --- | --- | --- |
| force (N) | Luminance (L) | Resolution (DPI) | Luminance (L) | Resolution (DPI) |
| Embodiment 1 | >16 | >100 | 600 | >69 | 600 |
| Embodiment 2 | >16 | >95 | 600 | >50 | 600 |
| Embodiment 3 | >16 | >94 | 600 | >53 | 600 |
| Embodiment 4 | >16 | >103 | 600 | >70 | 600 |
| Embodiment 5 | >16 | >93 | 600 | >51 | 600 |
| Embodiment 6 | >16 | >92 | 600 | >52 | 600 |
| Embodiment 7 | >16 | >86 | 600 | >51 | 600 |
| Embodiment 8 | >16 | >85 | 600 | >52 | 600 |
| Embodiment 9 | >16 | >92 | 600 | >47 | 600 |
| Embodiment 10 | >16 | >90 | 600 | >49 | 600 |
| Embodiment 11 | >16 | >84 | 600 | >40 | 600 |
| Embodiment 12 | >16 | >87 | 600 | >42 | 600 |
| Embodiment 13 | >16 | >88 | 600 | >48 | 600 |
| Embodiment 14 | >16 | >70 | 600 | >69 | 600 |
| Embodiment 15 | >16 | >100 | 600 | >35 | 600 |
| Embodiment 16 | >16 | >98 | 300 | >66 | 300 |

It may be seen from table 1 that the resolution of the pattern corresponding to the first ribbon area of the embodiments 1~15 may be 600 DPI, and may be higher than the resolution of the embodiment 16 (300 DPI). The resolution of the pattern corresponding to the second ribbon area in the embodiments 1~15 may also be 600 DPI and higher than the resolution of embodiment 16 (300 DPI). Thus, the resolution of the pattern of the shells of the above embodiments 1~15 may be high, and the color of the pattern of the shells of the above embodiments 1~15 may be more delicate. The drawing force of the texture layer and the first film in the shells of the embodiments 1~15 may be greater than 16N. Thus, the bonding force between the texture layer and the first film in the shells of the embodiment 1~15 may be strong enough, such that the appearance effect of the shells will not be affected due to the shedding or displacement of the texture layer. In the embodiments 1~15, the luminance of the pattern corresponding to the first ribbon area may be greater than 70, and the luminance of the pattern corresponding to the second ribbon area may be greater than 35. Thus, the shells of the embodiments 1~15 have the effect of illuminate pattern on partial area, and the luminance of the pattern corresponding to the first ribbon area may be higher than the luminance of the pattern corresponding to the second ribbon area, such that the shells have different luminance in different areas and better visual effects.

In conclusion, the patterns of the shells of the embodiments 1~15 have high resolution, fine color effects, good bonding forces between the texture layer and the first film, illuminate patterns on partial area, different luminance in different areas, many pattern styles, and better visual effects.

The technical features of the above embodiments may be combined arbitrarily. In order to make the description concise, not all possible combinations of the technical features in the above embodiments may be described. However, as long as the combination of these technical features does not conflict, it should be considered as the scope of the description.

The above described embodiments only express several embodiments of the present disclosure more specific and detailed, but it cannot be understood as the limitation of the scope of the present disclosure. It should be pointed out that, for those skilled in the art, without departing from the concept of the present disclosure, several deformations and improvements may be made, which belong to the protection scope of the present disclosure. Therefore, the scope of protection of the invention shall be subject to the claims.

What is claimed is:

1. A film structure, comprising:
   a first film assembly, comprising a first film and a texture layer stacked on one another sequentially; and
   a second film assembly, stacked on the first film assembly and comprising a second film and a ribbon unit disposed on the second film, wherein the ribbon unit is located adjacent to the first film, and an orthographic projection of the ribbon unit projected on a plane on which the texture layer is located falls in the texture layer,
   wherein the texture layer has a first texture area, and the first texture area having:
      a plurality of first convex bars parallel to each other and a plurality of second convex bars parallel to each other disposed in the first texture area, the plurality of first convex bars and the plurality of second convex bars are alternately arranged, and a height of each second convex bar is less than a height of each first convex bar; or
      a plurality of convex bar groups disposed in the first texture area, each convex bar group comprising a first convex bar and a second convex bar parallel to and spliced with each other, and a height of the second convex bar is less than a height of the first convex bar.

2. The film structure as claimed in claim 1, wherein each of the plurality of first convex bars and an adjacent one of the plurality of second convex bars are arranged without a gap.

3. The film structure as claimed in claim 1, wherein the plurality of convex bar groups are arranged in an array.

4. The film structure as claimed in claim 1, wherein a height difference between the first convex bar and the second convex bar is in a range from 2 μm to 4 μm, and a width of the first convex bar is equal to a width of the second convex bar.

5. The film structure as claimed in claim 1, wherein the ribbon unit comprises a first ribbon area, a position of the first ribbon area corresponds to a position of the first texture area, and an orthographic projection of the first ribbon area projected on a plane on which the first texture area is located falls in the first texture area.

6. The film structure as claimed in claim 5, wherein the ribbon unit comprises a first monochrome layer and a gradient color layer disposed in the first ribbon area, the first monochrome layer is disposed on the second film, and the gradient color layer is disposed at one side of the first monochrome layer away from the second film.

7. The film structure as claimed in claim 1, wherein the texture layer comprises a second texture area, and a plurality of third convex bars parallel to each other are disposed in the second texture area.

8. The film structure as claimed in claim 7, wherein a cross section of each first convex bar in a direction perpendicular to an extension direction of the first convex bar is in shape of a triangle or a trapezoid; and/or
   a cross section of each second convex bar in a direction perpendicular to an extension direction of the second convex bar is in shape of a triangle or a trapezoid; and/or
   a cross section of each third convex bar in a direction perpendicular to an extension direction of the third convex bar is in shape of a triangle or a trapezoid.

9. The film structure as claimed in claim 7, wherein the ribbon unit comprises a second ribbon area, a position of the second ribbon area corresponds to a position of the second texture area, and an orthographic projection of the second ribbon area projected on a plane on which the second texture area is located falls in the second texture area.

10. The film structure as claimed in claim 9, wherein the ribbon unit comprises a plurality of second monochrome layers in the second ribbon area, and the plurality of second monochrome layers are stacked on the second film sequentially.

11. The film structure as claimed in claim 7, wherein an extension line of the third convex bar along an extension direction of the third convex bar intersects with an extension line of the first convex bar along an extension direction of the first convex bar.

12. The film structure as claimed in claim 7, wherein a distance between an edge of the orthographic projection of the first ribbon area on the first texture area and an edge of the first texture area is greater than 0.2 millimeters.

13. The film structure as claimed in claim 1, wherein the first film assembly further comprises a reflection unit, and the reflection unit is coated at one side of the texture layer away from the first film;
    wherein the reflection unit comprises:
        an attaching layer, disposed at one side of the texture layer away from the first film;
        a first refraction layer, disposed at one side of the attaching layer away from the texture layer; and
        a second refraction layer, disposed at one side of the first refraction layer away from the attaching layer, and a refractive index of the first refraction layer is less than a refractive index of the second refraction layer.

14. The film structure as claimed in claim 13, wherein the reflection unit further comprises an interlayer, the interlayer is located between the first refraction layer and the second refraction layer, and the interlayer is an alumina layer or a silicon dioxide layer.

15. The film structure as claimed in claim 14, wherein the attaching layer is an alumina layer, and a thickness of the attaching layer is in a range from 30 nm to 40 nm;
    the first refraction layer is an indium layer, and a thickness of the first refraction layer is in a range from 10 nm to 30 nm;
    the interlayer is an alumina layer, and a thickness of the interlayer is in a range from 30 nm to 40 nm; and
    the second refraction layer is a titanium dioxide layer, and a thickness of the second refraction layer is in a range from 3 nm to 7 nm.

16. The film structure as claimed in claim 13, wherein the reflection unit further comprises a third refraction layer, the third refraction layer is located between the attaching layer and the first refraction layer, and a refractive index of the third refraction layer is greater than the refractive index of the first refraction layer.

17. The film structure as claimed in claim 16, wherein the reflection unit further comprises a first protection layer and a second protection layer, the first protection layer is located between the first refraction layer and the third refraction layer, the second protection layer is located between the first refraction layer and the second refraction layer, the first protection layer is an alumina layer or a silicon dioxide layer, and the second protection layer is an alumina layer or a silicon dioxide layer.

18. The film structure as claimed in claim 17, wherein the attaching layer is a silicon dioxide layer, and a thickness of the attaching layer is in a range from 8 nm to 12 nm;
    the third refraction layer is a trititanium pentoxide layer, and a thickness of the third refraction layer is in a range from 7 nm to 17 nm;
    the first protection layer is a silicon dioxide layer, and the thickness of the first protection layer is in a range from 10 nm to 20 nm;
    the first refraction layer is an indium layer, and a thickness of the first refraction layer is in a range from 10 nm to 20 nm;
    the second protection layer is a silicon dioxide layer, and a thickness of the second protection layer is in a range from 20 nm to 30 nm; and
    the second refraction layer is a trititanium pentoxide layer, and a thickness of the second refraction layer is in a range from 5 nm to 9 nm.

19. A shell, comprising:
    a substrate; and
    a film structure, wherein the film structure is located on the substrate, and the film structure comprises:
        a first film assembly, comprising a first film, a texture layer stacked on one another sequentially, and a reflection unit; and
        a second film assembly, stacked on the first film assembly and comprising a second film and a ribbon unit disposed on the second film,
    wherein the second film is disposed adjacent to the substrate, the ribbon unit is located adjacent to the first film, and an orthographic projection of the ribbon unit projected on a plane on which the texture layer is located falls in the texture layer,
    wherein the reflection unit is coated at one side of the texture layer away from the first film, and
    wherein the reflection unit comprises:
        an attaching layer, disposed at one side of the texture layer away from the first film;
        a first refraction layer, disposed at one side of the attaching layer away from the texture layer; and
        a second refraction layer, disposed at one side of the first refraction layer away from the attaching layer, and a refractive index of the first refraction layer is less than a refractive index of the second refraction layer.

20. An electronic device, comprising:
    a shell, comprising:
        a substrate; and
        a film structure, wherein the film structure is located on the substrate, and the film structure comprises:
            a first film assembly, comprising a first film and a texture layer stacked on one another sequentially; and
            a second film assembly, stacked on the first film assembly and comprising a second film and a ribbon unit disposed on the second film; wherein the second film is disposed adjacent to the substrate, the ribbon unit is located adjacent to the first film, and an orthographic projection of the ribbon unit projected on a plane on which the texture layer is located falls in the texture layer;
    a display connected to the shell, wherein an installation room is defined by the display and the shell; and
    a circuit board, located in the installation room and electrically connected to the display,
    wherein the texture layer has a first texture area, and the first texture area having:

a plurality of first convex bars parallel to each other and a plurality of second convex bars parallel to each other disposed in the first texture area, the plurality of first convex bars and the plurality of second convex bars are alternately arranged, and a height of each second convex bar is less than a height of each first convex bar; or a plurality of convex bar groups disposed in the first texture area, each convex bar group comprising a first convex bar and a second convex bar parallel to and spliced with each other, and a height of the second convex bar is less than a height of the first convex bar.

* * * * *